US012695027B2

(12) United States Patent
Tang et al.

(10) Patent No.: US 12,695,027 B2
(45) Date of Patent: Jul. 28, 2026

(54) PHOTOVOLTAIC CONVERTER AND PHOTOVOLTAIC GENERATION SYSTEM

(71) Applicant: Huawei Digital Power Technologies Co., Ltd., Shenzhen (CN)

(72) Inventors: Yunyu Tang, Shanghai (CN); Yaojia Zhang, Shanghai (CN); Lei Shi, Shanghai (CN); Chao Liu, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 221 days.

(21) Appl. No.: 18/630,167

(22) Filed: Apr. 9, 2024

(65) Prior Publication Data

US 2024/0258026 A1    Aug. 1, 2024

Related U.S. Application Data

(63) Continuation of application No. PCT/CN2023/100573, filed on Jun. 16, 2023.

(30) Foreign Application Priority Data

Jun. 27, 2022    (CN) .......................... 202210737173.6

(51) Int. Cl.
H01F 38/28        (2006.01)
G05F 1/32         (2006.01)
        (Continued)

(52) U.S. Cl.
CPC .............. H01F 38/28 (2013.01); G05F 1/32 (2013.01); H02M 3/22 (2013.01); G01R 15/183 (2013.01);
        (Continued)

(58) Field of Classification Search
CPC .... G05F 1/13; G05F 1/24; G05F 1/32; H02M 3/22; H02M 3/33523; G01R 15/183; H01F 38/28
See application file for complete search history.

(56) References Cited

U.S. PATENT DOCUMENTS

| | | | | |
|---|---|---|---|---|
| 2014/0252859 A1* | 9/2014 | Chisenga | .......... | H02M 7/53871 307/43 |
| 2015/0200584 A1* | 7/2015 | Kang | ................... | H02M 3/1584 363/16 |
| 2023/0194579 A1* | 6/2023 | Yang | .................... | G01R 15/183 324/126 |

FOREIGN PATENT DOCUMENTS

| | | |
|---|---|---|
| CN | 107728013 A | 2/2018 |
| CN | 108039267 A | 5/2018 |

(Continued)

*Primary Examiner* — Lakaisha Jackson
(74) *Attorney, Agent, or Firm* — Maier & Maier, PLLC

(57) ABSTRACT

A photovoltaic converter and a photovoltaic generation system. The photovoltaic converter is configured to electrically connect to a first photovoltaic module and a second photovoltaic module, where the first photovoltaic module includes a first positive electrode output end and a first negative electrode output end, and the second photovoltaic module includes a second positive electrode output end and a second negative electrode output end. The photovoltaic converter includes a current transformer and a power conversion circuit. The current transformer includes a magnetic structure, a first positive primary side winding, a second positive primary side winding, a negative primary side winding, and a first secondary side winding. The three primary side windings all pass through the magnetic structure and are spaced from each other. The first secondary side winding is wound around the magnetic structure. This reduces an occupied board area.

20 Claims, 11 Drawing Sheets

(51) Int. Cl.

| | | |
|---|---|---|
| *H02M 3/22* | (2006.01) | |
| *G01R 15/18* | (2006.01) | |
| *G05F 1/13* | (2006.01) | |
| *G05F 1/24* | (2006.01) | |
| *H02M 3/335* | (2006.01) | |

(52) U.S. Cl.
CPC .................. *G05F 1/13* (2013.01); *G05F 1/24* (2013.01); *H02M 3/33523* (2013.01)

(56) References Cited

FOREIGN PATENT DOCUMENTS

| | | | | | |
|---|---|---|---|---|---|
| CN | 208284334 | U | 12/2018 | | |
| CN | 110265210 | A | 9/2019 | | |
| CN | 112509789 | A | 3/2021 | | |
| CN | 113242015 | A * | 8/2021 | ............ | H02S 40/32 |
| CN | 111771250 | B | 8/2022 | | |
| CN | 115149900 | A | 10/2022 | | |
| DE | 102020115757 | A1 | 12/2021 | | |
| WO | 2019100996 | A1 | 5/2019 | | |

* cited by examiner

PHOTOVOLTAIC CONVERTER AND PHOTOVOLTAIC GENERATION SYSTEM

CROSS-REFERENCE TO RELATED APPLICATIONS

This application is a continuation of International Application No. PCT/CN2023/100573, filed on Jun. 16, 2023, which claims priority to Chinese Patent Application No. 202210737173.6, filed on Jun. 27, 2022. The disclosures of the aforementioned applications are hereby incorporated by reference in their entireties.

TECHNICAL FIELD

The embodiments relate to the field of electrical devices and to a photovoltaic converter and a photovoltaic generation system.

BACKGROUND

A photovoltaic converter is a core component in a photovoltaic generation system. The photovoltaic converter is used to convert a direct current output by a photovoltaic module into an alternating current for output. With long-term use of the photovoltaic module, aging of the photovoltaic module may easily cause a direct current arcing fault in the photovoltaic generation system, which may cause accidents such as a fire. Currently, a current transformer (CT) is usually used to collect an arcing signal on a direct current side of the photovoltaic converter, to detect the arcing signal, thereby avoiding accidents such as the fire caused by the direct current arcing fault. However, the photovoltaic module usually outputs a plurality of direct currents to the photovoltaic converter. Currently, a plurality of current transformers are used to collect arcing signals in direct currents, which has problems of low collection efficiency, a complex structure, and high costs.

SUMMARY

The embodiments provide a photovoltaic converter and a photovoltaic generation system, to resolve problems of low collection efficiency, a complex structure, and high costs in an arcing signal collection solution.

According to a first aspect, an embodiment provides a photovoltaic converter configured to electrically connect to a first photovoltaic module and a second photovoltaic module. The first photovoltaic module includes a first positive electrode output end and a first negative electrode output end, and the second photovoltaic module includes a second positive electrode output end and a second negative electrode output end. The photovoltaic converter includes a current transformer and a power conversion circuit. The current transformer includes a magnetic structure, a first positive primary side winding, a second positive primary side winding, a negative primary side winding, and a first secondary side winding. The first positive primary side winding passes through the magnetic structure, the first positive primary side winding includes a first end part and a second end part, the first end part is electrically connected to the first positive electrode output end, and the second end part is electrically connected to the power conversion circuit. The second positive primary side winding passes through the magnetic structure, and is spaced from the first positive primary side winding, the second positive primary side winding includes a third end part and a fourth end part, the third end part is electrically connected to the second positive electrode output end, and the fourth end part is electrically connected to the power conversion circuit. The negative primary side winding passes through the magnetic structure, and is spaced from the first positive primary side winding and the second positive primary side winding, the negative primary side winding includes a fifth end part and a sixth end part, the fifth end part is electrically connected to the first negative electrode output end and the second negative electrode output end, and the sixth end part is electrically connected to the power conversion circuit. The first secondary side winding is wound around the magnetic structure, and the first secondary side winding is configured to output a first induced current by coupling based on currents transmitted in the first positive primary side winding, the second positive primary side winding, and the negative primary side winding.

In the embodiments, the direct currents output by the first photovoltaic module and the second photovoltaic module are transmitted to the power conversion circuit through the current transformer, and the power conversion circuit outputs alternating currents based on the direct currents. The current transformer may be used to perform arcing detection on a direct current side of the photovoltaic converter. When an arcing fault occurs on the direct current side of the photovoltaic converter (for example, an arcing fault occurs on the first photovoltaic module or the second photovoltaic module due to aging), an arcing signal (a differential mode signal) exists in the direct current received by the direct current side of the photovoltaic converter, and the current transformer collects the arcing signal from the direct current, to facilitate subsequent detection of an arcing signal.

In the embodiments, the current transformer transmits, through the first positive primary side winding, the second positive primary side winding, and the negative primary side winding, a plurality of currents received from the direct current side of the photovoltaic converter. According to the principle of electromagnetic induction, the first secondary side winding outputs one first induced current according to a sum of magnetic fluxes generated by a current transmitted in each primary side winding, and the arcing signal may be transmitted to a subsequent component along with the first induced current output by the first secondary side winding, so as to detect the arcing signal. Therefore, the current transformer provided in the embodiments can collect arcing signals of the plurality of currents received from the direct current side of the photovoltaic converter once, so that arcing signals of the plurality of currents can be detected once, thereby avoiding collecting arcing signals of each current, and avoiding repeated detection of arcing signals of the plurality of currents. The design of the current transformer not only improves efficiency of collecting the arcing signals, but also reduces detection costs because of a simple structure. In addition, a quantity of current transformers is reduced, thereby reducing an occupied board area and facilitating a miniaturization design of the photovoltaic converter.

In a possible implementation, the first end part, the third end part, and the sixth end part are located on one side of the magnetic structure, and the fifth end part, the fourth end part, and the second end part are located on the other side of the magnetic structure.

When an arcing fault occurs on the direct current side of the photovoltaic converter, a common mode noise signal also exists in the direct current received by the direct current side of the photovoltaic converter. In other words, the first photovoltaic module outputs a first differential mode current and a first common mode current, and the second photovoltaic module outputs a second differential mode current and a second common mode current. The first positive primary side winding transmits the first differential mode current and the first common mode current, and both the first differential mode current and the first common mode current flow from the first end part to the second end part. The second positive primary side winding transmits the second differential mode current and the second common mode current, and both the second differential mode current and the second common mode current flow from the third end part to the fourth end part. The negative primary side winding transmits a third differential mode current (a combined current of the first differential mode current and the second differential mode current) and a third common mode current (a combined current of the first common mode current and the second common mode current), the third differential mode current flows from the sixth end part to the fifth end part, and the third common mode current flows from the fifth end part to the sixth end part.

Because the first end part, the third end part, and the sixth end part are located on one side of the magnetic structure, and the fifth end part, the fourth end part, and the second end part are located on the other side of the magnetic structure, such a design enables the first differential mode current, the second differential mode current, and the third differential mode current to pass through the magnetic structure in a same direction, and magnetic fluxes generated by the first differential mode current, the second differential mode current, and the third differential mode current in the magnetic structure are superimposed. In this way, the first common mode current and the second common mode current pass through the magnetic structure in a same direction, the third common mode current passes through the magnetic structure in a direction opposite to the direction in which the first common mode current and the second common mode current pass through the magnetic structure, and a sum of magnetic fluxes generated by the first common mode current and the second common mode current in the magnetic structure offsets a magnetic flux generated by the third common mode current in the magnetic structure, thereby suppressing the common mode current, reducing noise impact caused by the common mode current, and implementing independent measurement of the differential mode current. This facilitates subsequent detection of an arcing signal, and improves accuracy and a speed of subsequent arcing detection.

In a possible implementation, the magnetic structure has a traversing channel, the first positive primary side winding includes a first connection part, the second positive primary side winding includes a first fastening part, the negative primary side winding includes a first conductive part, the first connection part, the first fastening part; and the first conductive part all pass through the traversing channel and are spaced from each other, and the first conductive part is located between the first connection part and the first fastening part; and in an extension direction of the traversing channel, the first end part and the second end part are located at two opposite ends of the first connection part, the third end part is located at one end that is of the first fastening part and that faces the first end part, the fourth end part is located at the other end that is of the first fastening part and that faces the second end part, the fifth end part is located at one end that is of the first conductive part and that faces the second end part and the fourth end part, and the sixth end part is located at the other end that is of the first conductive part and that faces the first end part and the third end part.

In this way, the first connection part of the first positive primary side winding, the first fastening part of the second positive primary side winding, and the first conductive part of the negative primary side winding all pass through the traversing channel of the magnetic structure, magnetic fluxes generated by common mode currents transmitted in the three primary side windings have a same magnetic path. This facilitates suppressing of noise caused by the common mode current, thereby improving a capability of the current transformer to suppress common mode noise, and further facilitating subsequent detection of an arcing signal. In addition, because the first conductive part is located between the first connection part and the first fastening part, this facilitates offsetting of a sum of magnetic fluxes generated by common mode currents transmitted in the first connection part and the first fastening part with a magnetic flux generated by the common mode current transmitted in the first conductive part, thereby further improving the capability of the current transformer to suppress common mode noise, and further facilitating subsequent detection of an arcing signal.

In a possible implementation, the photovoltaic converter further includes a circuit board, the circuit board is electrically connected to the first photovoltaic module and the second photovoltaic module, and the circuit board is fastened to and electrically connected to the first end part, the second end part, the third end part, the fourth end part, the fifth end part, the sixth end part, and the power conversion circuit; and both the first end part and the second end part are located on one side that is of the fifth end part and that is close to the sixth end part, and both the third end part and the fourth end part are located on one side that is of the sixth end part and that is close to the fifth end part.

In this way, the current transformer and the power conversion circuit are electrically connected through the circuit board to form a whole, and the current transformer may be electrically connected to the first photovoltaic module and the second photovoltaic module through the circuit board. Two end parts of each winding of the current transformer may be respectively connected to a plurality of wires disposed on the circuit board one by one, so as to be electrically connected to other electronic devices. Because both the first end part and the second end part are located on one side that is of the fifth end part and that faces the sixth end part, both the third end part and the fourth end part are located on one side that is of the sixth end part and that faces the fifth end part. According to the circuit board designed based on such wiring of the current transformer, crossing of a plurality of wires that are disposed on the circuit board and connected to the foregoing end parts can be avoided, and wiring on the board is simplified. This facilitates wiring on the circuit board, simplifies wiring, and reduces wiring design costs.

In a possible implementation, in a height direction of the magnetic structure, the first conductive part is located between the first connection part and the first fastening part; in an extension direction of the traversing channel, the fifth end part and the sixth end part are disposed in a staggered manner; in a first direction, both the third end part and the fourth end part are located between the fifth end part and the sixth end part, the first end part is located on one side that is of the third end part and that is opposite to the sixth end part, and the second end part is located on one side that is of the fourth end part and that is opposite to the fifth end part; and the first direction is vertical to the extension direction of the traversing channel and is vertical to the height direction of the magnetic structure.

In this way, according to the circuit board designed based on such wiring of the current transformer, crossing of a plurality of wires that are disposed on the circuit board and connected to the foregoing end parts can be avoided, and wiring on the board is simplified. This facilitates wiring on the circuit board, simplifies wiring, and reduces wiring design costs. In addition, this improves space utilization of the current transformer in addition to avoiding wire crossing, thereby reducing a board area occupied by the current transformer, and facilitating miniaturization design of the current transformer.

In a possible implementation, in the height direction of the magnetic structure, the first conductive part is located between the first connection part and the first fastening part; in the extension direction of the traversing channel, the fifth end part and the sixth end part are disposed in a staggered manner; in the first direction, both the third end part and the second end part are located between the fifth end part and the sixth end part, the first end part is located on one side that is of the third end part and that is opposite to the sixth end part, and the fourth end part is located on one side that is of the second end part and that is opposite to the fifth end part; and the first direction is vertical to the extension direction of the traversing channel and is vertical to the height direction of the magnetic structure.

In this way, according to the circuit board designed based on such wiring of the current transformer, crossing of a plurality of wires that are disposed on the circuit board and connected to the foregoing end parts can be avoided, and wiring on the board is simplified. This facilitates wiring on the circuit board, simplifies wiring, and reduces wiring design costs. In addition, this improves space utilization of the current transformer in addition to avoiding wire crossing, thereby reducing a board area occupied by the current transformer, and facilitating miniaturization design of the current transformer.

In a possible implementation, the first positive primary side winding includes a second connection part and a third connection part, both the second connection part and the third connection part extend in the height direction of the magnetic structure, the second connection part and the third connection part are respectively connected to two opposite end parts of the first connection part, the second connection part and the third connection part are located on two opposite sides of the magnetic structure, an end part that is of the second connection part and that is opposite to the first connection part is the first end part, and an end part that is of the third connection part and that is opposite to the first connection part is the second end part.

The second positive primary side winding includes a second fastening part and a third fastening part, both the second fastening part and the third fastening part extend in the height direction of the magnetic structure, the second fastening part and the third fastening part are respectively connected to two opposite end parts of the first fastening part, the second fastening part is disposed on one side that is of the magnetic structure and that faces the second connection part, and is spaced from the second connection part, the third fastening part is disposed on one side that is of the magnetic structure and that faces the third connection part, and is spaced from the third connection part, an end part that is of the second fastening part and that is opposite to the first fastening part is the third end part, and an end part that is of the third fastening part and that is opposite to the first fastening part is the fourth end part; and the negative primary side winding includes a second conductive part and a third conductive part, both the second conductive part and the third conductive part extend in the height direction of the magnetic structure, the second conductive part and the third conductive part are respectively connected to two opposite end parts of the first conductive part, the second conductive part is disposed on one side that is of the magnetic structure and that faces the third connection part and the third fastening part, and is spaced from the third connection part and the third fastening part, the third conductive part is disposed on one side that is of the magnetic structure and that faces the second connection part and the second fastening part, and is spaced from the second connection part and the second fastening part, an end part that is of the second conductive part and that is opposite to the first conductive part is the fifth end part, and an end part that is of the third conductive part and that is opposite to the first conductive part is the sixth end part.

The first positive primary side winding, the second positive primary side winding, and the negative primary side winding that are disposed in such a way have a stable structure. This improves overall structure stability of the current transformer and facilitates connection to the circuit board, thereby facilitating installation of the current transformer on the circuit board and reducing assembly difficulty.

In a possible implementation, the first connection part, first fastening part, and the first conductive part all extend in the extension direction of the traversing channel.

In this way, because the first connection part, the first fastening part, and the first conductive part all extend in extension direction of the traversing channel, each differential mode current and each common mode current that are transmitted in the first connection part, the first fastening part, and the first conductive part can vertically pass through the magnetic structure. In this way, the magnetic fluxes generated by the common mode current and the differential mode current in the magnetic structure are higher, so that the first secondary side winding outputs the first induced current.

In a possible implementation, in the extension direction of the traversing channel, a spacing between the first end part and the second end part, a spacing between the third end part and the fourth end part, and a spacing between the fifth end part and the sixth end part are equal.

This reduces a size of the current transformer in the extension direction of the traversing channel, and reduces a board area occupied by the current transformer, thereby facilitating the miniaturization design of the current transformer.

In a possible implementation, in a direction vertical to the extension direction of the traversing channel, a projection of the first connection part, a projection of the first fastening part, and a projection of the first conductive part all overlap.

This improves space utilization of the first positive primary side winding, the second positive primary side winding, and the negative primary side winding in the traversing channel, and reduces a board area occupied by the current transformer, thereby facilitating the miniaturization design of the current transformer.

In a possible implementation, the magnetic structure is provided with an air gap, and the air gap communicates with the traversing channel.

The design of the air gap effectively reduces magnetic permeability of the magnetic structure, effectively increases saturation magnetization intensity of the magnetic structure, and avoids a magnetic saturation phenomenon of the magnetic structure in a working process. In addition, the structure is simple, which facilitates design.

In a possible implementation, the magnetic structure includes a first magnetic core and a second magnetic core, and the first magnetic core is spaced opposite to the second magnetic core and has the air gap.

In this way, a length of the air gap may be changed by changing a relative position between the first magnetic core and the second magnetic core, so as to change the magnetic permeability and the saturation magnetization intensity of the magnetic structure. This facilitates adjustment of the magnetic permeability and the saturation magnetization intensity of the magnetic structure as required, so as to avoid a magnetic saturation phenomenon in a working process of the magnetic structure. This not only simplifies adjustment, but also avoids processing the first magnetic core and the second magnetic core for a plurality of times, thereby reducing processing costs.

In a possible implementation, the current transformer further includes a fastener, the magnetic structure is fastened to the fastener, and the first positive primary side winding, the second positive primary side winding, and the negative primary side winding penetrates into the fastener; and the first end part, the second end part, the third end part, the fourth end part, the fifth end part, and the sixth end part are located on one side that is of the fastener and that is opposite to the magnetic structure.

In this way, the magnetic structure, the first positive primary side winding, the second positive primary side winding, and the negative primary side winding are assembled together by using the fastener, and the structure is simple and stable, which improves overall structure stability of the current transformer. In addition, the first end part, the second end part, the third end part, the fourth end part, the fifth end part, and the sixth end part are designed to be located on one side that is of the fastener and that is opposite to the magnetic structure, which facilitates installation of the current transformer and the circuit board and reduces assembly difficulty.

In a possible implementation, the current transformer further includes a second secondary side winding, the second secondary side winding is wound around the magnetic structure, and is spaced from the first secondary side winding, and the second secondary side winding is configured to output a second induced current by coupling based on the currents transmitted in the first positive primary side winding, the second positive primary side winding, and the negative primary side winding.

In this way, according to the principle of electromagnetic induction, the second secondary side winding may also generate output a current according to a sum of magnetic fluxes generated by a current transmitted in each primary side winding. If a quantity of turns of the second secondary side winding is different from a quantity of turns of the first secondary side winding, the magnitude of the current output by the second secondary side winding is different from the magnitude of the current output by the first secondary side winding; or if the quantity of turns of the second secondary side winding is the same as the quantity of turns of the first secondary side winding, the magnitude of the current output by the second secondary side winding is the same as the magnitude of the current output by the first secondary side winding. The current transformer may be provided with a plurality of secondary side windings with different or the same quantity of turns, so as to output a plurality of same or different currents that meet a requirement.

In a possible implementation, the power conversion circuit includes a boosting module and an inverter module, and the boosting module is electrically connected to the second end part, the fourth end part, and the sixth end part, and is electrically connected to the inverter module.

In this way, after the direct currents output by the first photovoltaic module and the second photovoltaic module are boosted by the boosting module, the boosting module outputs the boosted currents to the inverter module, and the inverter module may perform inversion processing on the boosted currents to output alternating currents for supplying to alternating current loads. The boosting module is designed to ensure that the alternating currents output after the inverter module performs inversion meets the expectation.

In a possible implementation, the photovoltaic converter further includes a detection module, and the detection module is electrically connected to the first secondary side winding.

In this way, the detection module may perform arcing detection on the first induced current output by the first secondary side winding, to avoid various safety accidents caused by an arcing fault.

According to a second aspect, an embodiment further provides a photovoltaic generation system, including the photovoltaic converter, the first photovoltaic module, and the second photovoltaic module according to any one of the first aspect or the possible implementations of the first aspect, where the first photovoltaic module includes a first positive electrode output end and a first negative electrode output end, the second photovoltaic module includes a second positive electrode output end and a second negative electrode output end, the first positive electrode output end is electrically connected to a first end part, the second positive electrode output end is electrically connected to a third end part, and both the first negative electrode output end and the second negative electrode output end are electrically connected to a fifth end part.

BRIEF DESCRIPTION OF DRAWINGS

To describe the solutions in embodiments or the background more clearly, the following describes the accompanying drawings.

DETAILED DESCRIPTION OF EMBODIMENTS

An embodiment provides a photovoltaic converter, and can be applied to a photovoltaic generation system. A photovoltaic generation system is a power generation system that uses the photovoltaic effect to directly convert solar radiation energy into electric energy. In the embodiments, that a component A is connected to a component B means that the component A is directly or indirectly connected to the component B. The connection includes a fixed connection and an electrical connection.

The following describes embodiments with reference to the accompanying drawings.

Figure 1:
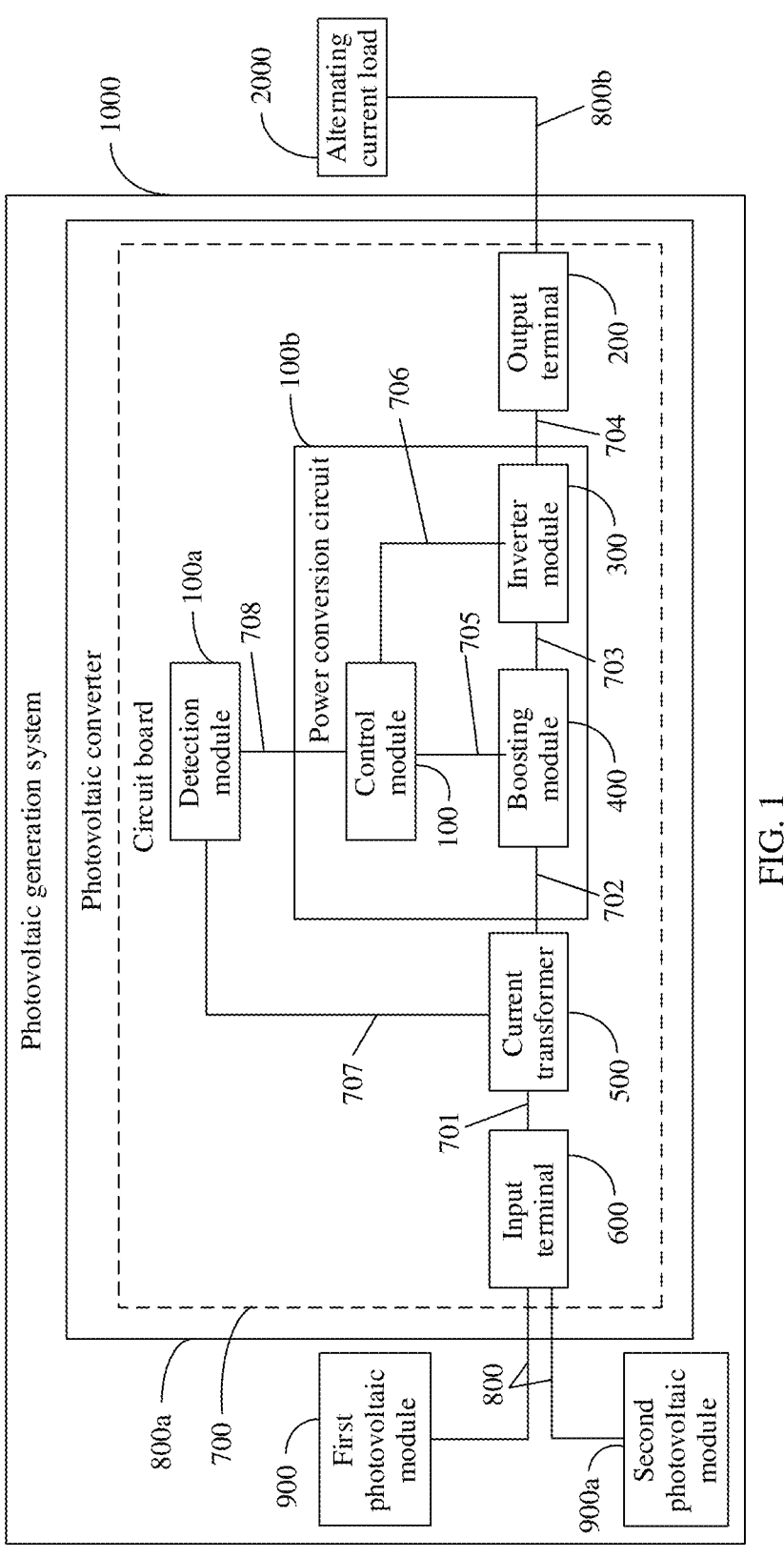
FIG. 1 is a block diagram of a structure for coordination between a photovoltaic generation system and an alternating current load according to an embodiment.
Figure 2:
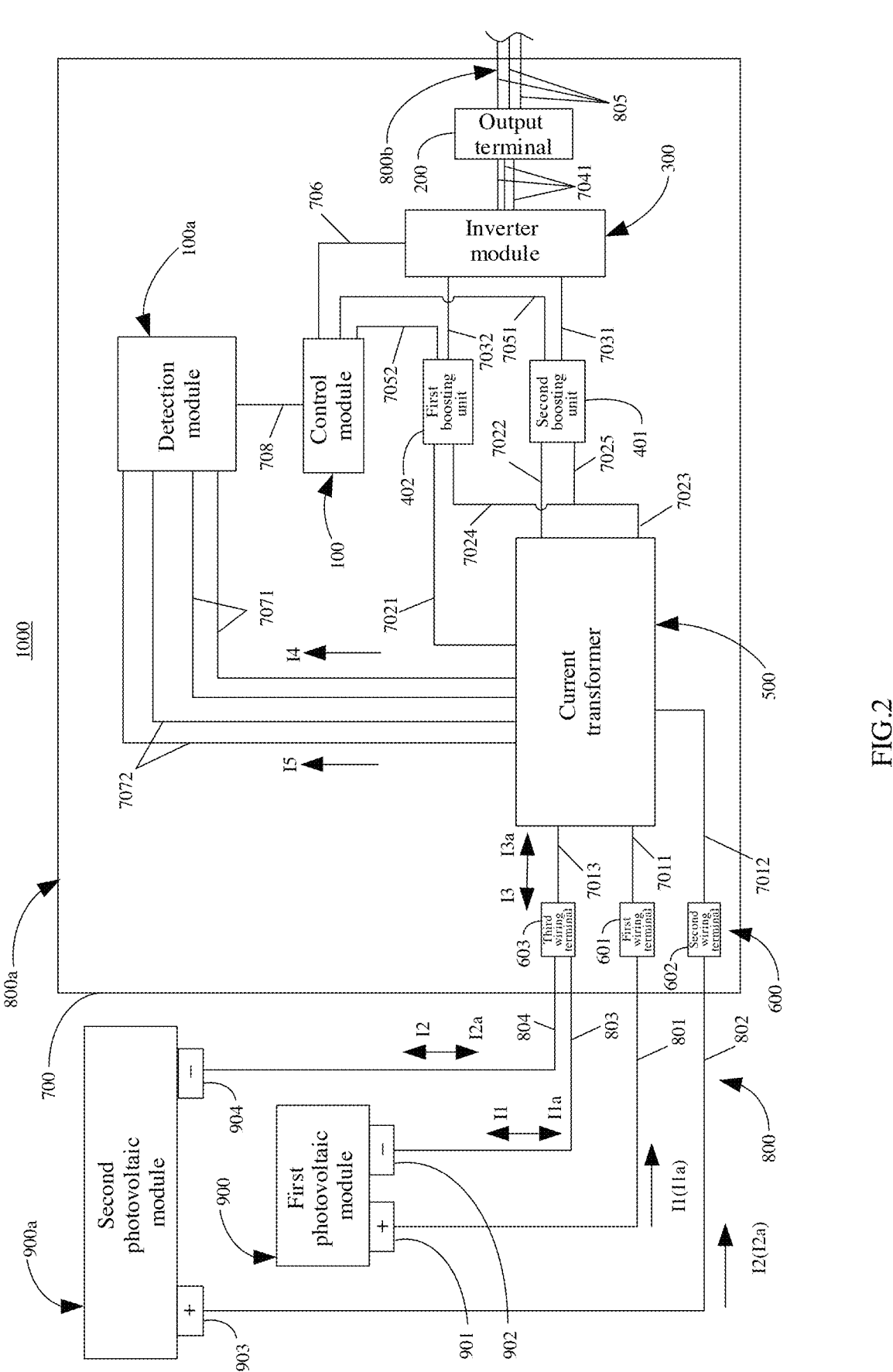
FIG. 2 is a schematic diagram of a structure of the photovoltaic generation system shown in FIG. 1.

Refer to FIG. 1 and FIG. 2. FIG. 1 is a block diagram of a structure for coordination between a photovoltaic generation system 1000 and an alternating current load 2000 according to an embodiment. FIG. 2 is a schematic diagram of a structure of the photovoltaic generation system 1000 shown in FIG. 1. The photovoltaic generation system 1000 is configured to convert solar radiation energy into electric energy for supplying to the alternating current load 2000.

As shown in FIG. 1, the photovoltaic generation system 1000 includes a first photovoltaic module 900, a second photovoltaic module 900*a*, a first cable assembly 800, a photovoltaic converter 800*a*, and a second cable assembly 800*b*. The first photovoltaic module 900 and the second photovoltaic module 900*a* are configured to convert solar energy into direct currents for output. The first photovoltaic module 900 and the second photovoltaic module 900*a* are connected to the first cable assembly 800, the first cable assembly 800 is connected to the photovoltaic converter 800*a*, and the first cable assembly 800 is configured to transmit, to the photovoltaic converter 800*a*, the direct currents that are output by the first photovoltaic module 900 and the second photovoltaic module 900*a*. The photovoltaic converter 800*a* is configured to convert the direct currents output by the first photovoltaic module 900 and the second photovoltaic module 900*a* into alternating currents for output. The second cable assembly 800*b* is connected to the photovoltaic converter 800*a* and the alternating current load 2000, and the second cable assembly 800*b* is configured to transmit, to the alternating current load 2000, the alternating current output by the photovoltaic converter 800*a*, for supplying to the alternating current load 2000. The alternating current load 2000 may be any device or apparatus that uses, stores, or transmits an alternating current, such as a refrigerator, an air conditioner, or a mains supply network. This is not limited. In some other embodiments, there may be more (for example, two, three, or four) first photovoltaic modules 900, and there may be more (for example, two, three, or four) second photovoltaic modules 900*a*.

In some embodiments, the photovoltaic converter 800*a* includes a circuit board 700, an input terminal 600, a current transformer 500, a boosting module 400, an inverter module 300, an output terminal 200, a control module 100, and a detection module 100*a*. The boosting module 400, the inverter module 300, and the control module 100 form a power conversion circuit 100*b*. It may be understood that the power conversion circuit 100*b* includes the boosting module 400, the inverter module 300, and the control module 100. In other words, the photovoltaic converter 800*a* includes the circuit board 700, the input terminal 600, the current transformer 500, the power conversion circuit 100*b*, the output terminal 200, and the detection module 100*a*.

The circuit board 700 is configured to carry the input terminal 600, the current transformer 500, the boosting module 400, the inverter module 300, the output terminal 200, the control module 100, and the detection module 100*a*. The input terminal 600 is electrically connected to the current transformer 500. The current transformer 500 is electrically connected to the boosting module 400. The boosting module 400 is electrically connected to the inverter module 300. The inverter module 300 is electrically connected to the output terminal 200. The control module 100 is electrically connected to the boosting module 400, the inverter module 300, and the detection module 100*a*. The detection module 100*a* is electrically connected to the current transformer 500. The control module 100 is configured to control the boosting module 400, the inverter module 300, and the detection module 100*a* to work, so as to control the photovoltaic converter 800*a* to work. The input terminal 600 is connected to the first cable assembly 800. The input terminal 600 is electrically connected to the first photovoltaic module 900 and the second photovoltaic module 900*a* through the first cable assembly 800. The output terminal 200 is connected to the second cable assembly 800*b*. The output terminal 200 is electrically connected to the alternating current load 2000 through the second cable assembly 800*b*. It may be understood that the circuit board 700 is electrically connected to the input terminal 600, the first photovoltaic module 900, and the second photovoltaic module 900*a* through the first cable assembly 800.

Direct currents output by the first photovoltaic module 900 and the second photovoltaic module 900*a* are transmitted to the boosting module 400 along the first cable assembly 800 sequentially through the input terminal 600 and the current transformer 500. The boosting module 400 is configured to: output boosted currents to the inverter module 300 after performing boosting processing on the direct currents output by the first photovoltaic module 900 and the second photovoltaic module 900*a*, where the boosted currents are direct currents. The inverter module 300 is configured to perform inversion processing on the direct currents (that is, the boosted currents) obtained by performing boosting processing by the boosting module 400, to convert the boosted currents into alternating currents, and transmit the alternating currents to the output terminal 200. An alternating current is transmitted to the alternating current load 2000 along the second cable assembly 800*b* through the output terminal 200, for supplying to the alternating current load 2000. It may be understood that the currents output by the first photovoltaic module 900 and the second photovoltaic module 900a are transmitted to the power conversion circuit 100b through the current transformer 500, and the power conversion circuit 100b outputs an alternating current for supplying to the alternating current load 2000.

The current transformer 500 is configured to output an induced current to the detection module 100a based on the direct currents output by the first photovoltaic module 900 and the second photovoltaic module 900a, where a value of the induced current is less than a value of the direct current. The detection module 100a is configured to perform arcing detection on the induced current, to determine whether an arcing signal exists in the induced current. If the detection module 100a detects the arcing signal in the induced current, the detection module 100a outputs a control signal to the control module 100. The control signal is used to control the photovoltaic converter 800a to stop working. It should be noted that the arcing signal is a differential mode current signal generated when a direct current arcing phenomenon occurs in the photovoltaic generation system 1000 (for example, the direct current arcing phenomenon occurs in the first photovoltaic module 900 and the second photovoltaic module 900a due to aging).

As shown in FIG. 1 and FIG. 2, for example, both the first photovoltaic module 900 and the second photovoltaic module 900a include a plurality of solar cells, and a plurality of solar cell arrays are disposed. The first photovoltaic module 900 includes a first positive electrode output end 901 and a first negative electrode output end 902. The first positive electrode output end 901 is located on one side of the first negative electrode output end 902, and is spaced from the first negative electrode output end 902. A potential of the first negative electrode output end 902 is lower than a potential of the first positive electrode output end 901. The first positive electrode output end 901 is configured to output a first differential mode current I1, and the first negative electrode output end 902 is configured to receive the first differential mode current I1.

The second photovoltaic module 900a is located on one side of the first photovoltaic module 900. The second photovoltaic module 900a includes a second positive electrode output end 903 and a second negative electrode output end 904. The second positive electrode output end 903 is located on one side of the second negative electrode output end 904, and is spaced from the second negative electrode output end 904. A potential of the second negative electrode output end 904 is lower than a potential of the second positive electrode output end 903. The second positive electrode output end 903 is configured to output a second differential mode current I2, and the second negative electrode output end 904 is configured to receive the second differential mode current I2. The second positive electrode output end 903 is located on one side that is of the first positive electrode output end 901 and that is opposite to the first negative electrode output end 902. The second negative electrode output end 904 is located on one side that is of the first negative electrode output end 902 and that is opposite to the first positive electrode output end 901. A value of the second differential mode current I2 is equal to a value of the first differential mode current I1. In some other embodiments, the value of the first differential mode current I1 may not be equal to the value of the second differential mode current I2. This is not limited.

The first cable assembly 800 includes a first cable 801, a second cable 802, a third cable 803, and a fourth cable 804. The second cable 802, the first cable 801, the third cable 803, and the fourth cable 804 are sequentially spaced from each other. The first cable 801 is connected to the first positive electrode output end 901 and the input terminal 600 of the photovoltaic converter 800a. The second cable 802 is connected to the second positive electrode output end 903 and the input terminal 600 of the photovoltaic converter 800a. The third cable 803 is connected to the first negative electrode output end 902 and the input terminal 600 of the photovoltaic converter 800a. The fourth cable 804 is connected to the second negative electrode output end 904 and the input terminal 600 of the photovoltaic converter 800a. It may be understood that the first photovoltaic module 900 is electrically connected to the input terminal 600 of the photovoltaic converter 800a through the first cable 801 and the third cable 803. The first differential mode current I1 that is output by the first photovoltaic module 900 from the first positive electrode output end 901 is transmitted to the photovoltaic converter 800a along the first cable 801 through the input terminal 600, and then flows back to the first negative electrode output end 902 along the third cable 803 through the input terminal 600 after passing through the photovoltaic converter 800a. It may be understood that the second photovoltaic module 900a is electrically connected to the input terminal 600 of the photovoltaic converter 800a through the second cable 802 and the fourth cable 804. The second differential mode current I2 that is output by the second photovoltaic module 900a from the second positive electrode output end 903 is transmitted to the photovoltaic converter 800a along the second cable 802 through the input terminal 600, and then flows back to the second negative electrode output end 904 along the fourth cable 804 through the input terminal 600 after passing through the photovoltaic converter 800a.

It should be noted that, in a process in which the first differential mode current I1 output by the first positive electrode output end 901 of the first photovoltaic module 900 flows back to the first negative electrode output end 902 through the photovoltaic converter 800a, the photovoltaic converter 800a generates a noise signal, and the noise signal exists in the first differential mode current I1; and in a process in which the second differential mode current I2 output by the second positive electrode output end 903 of the second photovoltaic module 900a flows back to the second negative electrode output end 904 through the photovoltaic converter 800a, the photovoltaic converter 800a generates a noise signal, and the noise signal exists in the second differential mode current I2. The noise signal includes a common mode noise signal, that is, a common mode current (if directions of a current are the same from a perspective of a pair of a positive electrode input end and a negative electrode output end in a system, the current is referred to as a common mode current). In this embodiment, a first common mode current I1a exists in both the first differential mode current I1 transmitted in the first cable 801 and the first differential mode current I1 transmitted in the third cable 803, where the first differential mode current I1 and the first common mode current I1a that are transmitted in the first cable 801 have a same direction, and the first differential mode current I1 and the first common mode current I1a that are transmitted in the third cable 803 have opposite directions. A second common mode current I2a exists in both the second differential mode current I2 transmitted in the second cable 802 and the second differential mode current I2 transmitted in the fourth cable 804, where the second differential mode current I2 and the second common mode current I2a that are transmitted in the second cable 802 have a same direction, and the second differential mode current I2 and the second common mode current I2a that are transmitted in the fourth cable 804 have opposite directions. A value of the first common mode current I1a is equal to a value of the second common mode current I2a. In some other embodiments, the value of the first common mode current I1a may not be equal to the value of the second common mode current I2a.

The second cable assembly 800b includes three fifth cables 805, and the three fifth cables 805 are sequentially arranged at intervals. One end of each fifth cable 805 is connected to the output terminal 200 of the photovoltaic converter 800a, and the other end thereof is connected to the alternating current load 2000. The alternating current output by the photovoltaic converter 800a is transmitted to the alternating current load 2000 through the three fifth cables 805. In some other embodiments, there may be more (for example, six, nine, or twelve) fifth cables 805. This is not limited.

For example, the circuit board 700 is a rectangular circuit board. In some other embodiments, the circuit board 700 may alternatively be a specially-shaped circuit board such as a circular circuit board or a triangular circuit board. A shape of the circuit board is not limited. Functional lines are disposed on the circuit board 700, and the functional lines include a first line 701, a second line 702, a third line 703, a fourth line 704, a fifth line 705, a sixth line 706, a seventh line 707, and an eighth line 708. For example, the foregoing lines form a conductive layer that is made of conductive materials such as copper and aluminum and that is disposed on the circuit board 700. The following describes the foregoing lines with reference to modules of the photovoltaic converter 800a.

The input terminal 600 is disposed on one side of the circuit board 700. In some embodiments, the input terminal 600 is disposed on one side of a length direction of the circuit board 700. The input terminal 600 includes a first wiring terminal 601, a second wiring terminal 602, and a third wiring terminal 603. In a width direction of the circuit board 700, the second wiring terminal 602, the first wiring terminal 601, and the third wiring terminal 603 are sequentially arranged on one side of the circuit board 700. The first wiring terminal 601 is connected to the first cable 801, the second wiring terminal 602 is connected to the second cable 802, and the third wiring terminal 603 is connected to the third cable 803 and the fourth cable 804. In some other embodiments, the input terminal 600 may further include more (for example, four or five) wiring terminals. This is not limited.

In the length direction of the circuit board 700, the current transformer 500 is located at one end of the input terminal 600, and is electrically connected to the input terminal 600. For example, the current transformer 500 is located at one end of the first wiring terminal 601, the second wiring terminal 602, and the third wiring terminal 603, and is located on one side of the second wiring terminal 602. The current transformer 500 is electrically connected to the first wiring terminal 601, the second wiring terminal 602, and the third wiring terminal 603.

The first line 701 is located between the input terminal 600 and the current transformer 500, and is connected to the input terminal 600 and the current transformer 500. The first line 701 is configured to implement an electrical connection between the input terminal 600 and the current transformer 500. For example, the first line 701 includes a first wire 7011, a second wire 7012, and a third wire 7013. In the width direction of the circuit board 700, the second wire 7012, the first wire 7011, and the third wire 7013 are sequentially arranged. One end of the first wire 7011 is connected to the first wiring terminal 601, and the other end thereof is connected to the current transformer 500. One end of the second wire 7012 is connected to the second wiring terminal 602, and the other end thereof is connected to the current transformer 500. One end of the third wire 7013 is connected to the third wiring terminal 603, and the other end thereof is connected to the current transformer 500. The first wiring terminal 601, the second wiring terminal 602, and the third wiring terminal 603 are electrically connected to the current transformer 500 through the first wire 7011, the second wire 7012, and the third wire 7013.

The boosting module 400 is located at one end that is of the current transformer 500 and that is opposite to the input terminal 600, and is electrically connected to the current transformer 500. For example, the boosting module 400 includes a first boosting unit 401 and a second boosting unit 402. In the width direction of the circuit board 700, the first boosting unit 401 is spaced opposite to the second boosting unit 402, where the first boosting unit 401 is located at one end of the current transformer 500, and is electrically connected to the current transformer 500; and the second boosting unit 402 is located at one end of the current transformer 500 and is located on one side of the current transformer 500, and is electrically connected to the current transformer 500.

The second line 702 is located between the current transformer 500 and the boosting module 400, and is connected to the current transformer 500 and the boosting module 400. The second line 702 is configured to implement an electrical connection between the current transformer 500 and the boosting module 400. For example, the second line 702 includes a fourth wire 7021, a fifth wire 7022, a sixth wire 7023, a seventh wire 7024, and an eighth wire 7025. In the width direction of the circuit board 700, the fourth wire 7021, the fifth wire 7022, and the sixth wire 7023 are sequentially arranged. The seventh wire 7024 crosses the fifth wire 7022, and is connected to the sixth wire 7023. One end of the seventh wire 7024 is connected to one end of the sixth wire 7023, and the other end of the seventh wire 7024 is located between the fourth wire 7021 and the fifth wire 7022. The eighth wire 7025 is located on one side that is of the fifth wire 7022 and that is opposite to the fourth wire 7021, and is connected to the sixth wire 7023 and the seventh wire 7024. One end of the eighth wire 7025 is connected to one end connected to the sixth wire 7023 and the seventh wire 7024.

One end of the fourth wire 7021 is connected to the current transformer 500, and the other end thereof is connected to the second boosting unit 402. One end of the fifth wire 7022 is connected to the current transformer 500, and the other end thereof is connected to the first boosting unit 401. One end that is of the sixth wire 7023 and that is away from the seventh wire 7024 and the eighth wire 7025 is connected to the current transformer 500. One end that is of the seventh wire 7024 and that is away from the sixth wire 7023 is connected to the second boosting unit 402. One end that is of the eighth wire 7025 and that is away from the sixth wire 7023 is connected to the first boosting unit 401. The second boosting unit 402 is electrically connected to the current transformer 500 through the fourth wire 7021, the seventh wire 7024, and the sixth wire 7023; and the first boosting unit 401 is electrically connected to the current transformer 500 through the fifth wire 7022, the eighth wire 7025, and the sixth wire 7023.

The inverter module 300 is located at one end that is of the boosting module 400 and that is opposite to the current transformer 500, and is electrically connected to the boosting module 400. For example, the inverter module 300 is electrically connected to the first boosting unit 401 and the second boosting unit 402. The third line 703 is located between the boosting module 400 and the inverter module 300, and is connected to the boosting module 400 and the inverter module 300. The third line 703 is configured to implement an electrical connection between the boosting module 400 and the inverter module 300. For example, the third line 703 includes a first subline 7031 and a second subline 7032. In the width direction of the circuit board 700, the first subline 7031 and the second subline 7032 are arranged at an interval. One end of the first subline 7031 is connected to the first boosting unit 401, and the other end thereof is connected to the inverter module 300. One end of the second subline 7032 is connected to the second boosting unit 402, and the other end thereof is connected to the inverter module 300. The inverter module 300 is electrically connected to the first boosting unit 401 and the second boosting unit 402 respectively through the first subline 7031 and the second subline 7032.

The output terminal 200 is located on one side that is of the inverter module 300 and that is opposite to the boosting module 400, and is electrically connected to the inverter module 300. The fourth line 704 is located between the output terminal 200 and the inverter module 300, and is connected to the inverter module 300 and the output terminal 200. The fourth line 704 is configured to implement an electrical connection between the output terminal 200 and the inverter module 300. For example, the fourth line 704 includes three output wires 7041. In the width direction of the circuit board 700, the three output wires 7041 are sequentially arranged at intervals, where one end of each output line 7041 is connected to the inverter module 300, and the other end thereof is connected to the output terminal 200. In some other embodiments, the fourth line 704 may further include more (for example, six or nine) output wires 7041. This is not limited. The output terminal 200 is connected to the three fifth cables 805 of the second cable assembly 800b.

The control module 100 is located at one end of the boosting module 400, and is electrically connected to the boosting module 400 and the inverter module 300. For example, the control module 100 is located on one side that is of the second boosting unit 402 and that is opposite to the first boosting unit 401. The fifth line 705 is located between the boosting module 400 and the inverter module 300, and is connected to the control module 100 and the boosting module 400. The fifth line 705 is configured to implement an electrical connection between the control module 100 and the boosting module 400. For example, the fifth line 705 includes a first control wire 7051 and a second control wire 7052. In the width direction of the circuit board 700, the first control wire 7051 and the second control wire 7052 are arranged at an interval. One end of the first control wire 7051 is located between the first subline 7031 and the second subline 7032, and is connected to the first boosting unit 401; and the other end thereof is located on one side that is of the second subline 7032 and that is opposite to the first subline 7031, and is connected to the control module 100, and the first control wire 7051 crosses the second subline 7032.

In the width direction of the circuit board 700, the second control wire 7052 is located between the second boosting unit 402 and the first control wire 7051. In the length direction of the circuit board 700, the second control wire 7052 is located between the first control wire 7051 and the second subline 7032. One end of the second control wire 7052 is connected to the second boosting unit 402, and the other end thereof is connected to the control module 100. The control module 100 is electrically connected to the first boosting unit 401 and the second boosting unit 402 respectively through the first control wire 7051 and the second control wire 7052.

The sixth line 706 is located on one side that is of the control module 100 and that faces the inverter module 300, is located at one end that is of the inverter module 300 and that faces the control module 100, and is connected to the control module 100 and the inverter module 300. The sixth line 706 is configured to implement an electrical connection between the control module 100 and the inverter module 300. For example, one end of the sixth line 706 is located on one side that is of the first control wire 7051 and that is opposite to the first subline 7031, and is connected to the control module 100; and the other end of the sixth line 706 is connected to one end that is of the inverter module 300 and that faces the control module 100. The control module 100 is electrically connected to the inverter module 300 through the sixth line 706. Therefore, the control module 100 may control the first boosting unit 401, the second boosting unit 402, and the inverter module 300 to work.

After the first differential mode current I1 output by the first photovoltaic module 900 from the first positive electrode output end 901 is transmitted to the first wiring terminal 601 along the first cable 801, the first differential mode current I1 is transmitted from the first wiring terminal 601 to the current transformer 500 along the first wire 7011. Then, after the current is transmitted from the current transformer 500 to the second boosting unit 402 along the fourth wire 7021, the current is transmitted from the second boosting unit 402 to the current transformer 500 sequentially along the seventh wire 7024 and the sixth wire 7023. Then, after the current is transmitted from the current transformer 500 to the third wiring terminal 603 along the third wire 7013, the current flows back to the first negative electrode output end 902 along the third cable 803 from the third wiring terminal 603.

It may be understood that the first wire 7011, the fourth wire 7021, and the third wire 7013 all transmit the first differential mode current I1 and the first common mode current I1a. The first differential mode current I1 and the first common mode current I1a that are transmitted in the first wire 7011 and the fourth wire 7021 have a same direction. For example, both the first differential mode current I1 and the first common mode current I1a are transmitted from the first wiring terminal 601 to the current transformer 500 along the first wire 7011, and then transmitted to the second boosting unit 402 along the fourth wire 7021. The first differential mode current I1 and the first common mode current I1a that are transmitted in the third wire 7013 and the sixth wire 7023 have opposite directions. For example, after the first differential mode current I1 is transmitted to the current transformer 500 along the sixth wire 7023, the first differential mode current I1 is transmitted to the third wiring terminal 603 along the third wire 7013; and after the first common mode current I1a is transmitted from the third wiring terminal 603 to the current transformer 500 along the third wire 7013, the first common mode current I1a is transmitted to the first boosting unit 401 and the second boosting unit 402 along the sixth wire 7023.

When the first differential mode current I1 flowing through the current transformer 500 is transmitted to the second boosting unit 402 along the fourth wire 7021, the control module 100 controls the second boosting unit 402 to perform boosting processing on the first differential mode current I1. After performing boosting processing on the first differential mode current I1, the second boosting unit 402 outputs a first boosted current. In other words, the second boosting unit 402 is configured to output the first boosted current after performing boosting processing on the first differential mode current I1. It should be noted that the first boosted current is a direct current, and the first differential mode current I1 transmitted from the second boosting unit 402 to the current transformer 500 along the seventh wire 7024 and the sixth wire 7023 is not boosted. The first boosted current is transmitted from the second boosting unit 402 to the inverter module 300 through the second subline 7032. The control module 100 controls the inverter module 300 to perform inversion processing on the first boosted current, to convert the first boosted current into a first alternating current for output. After the first alternating current is transmitted from the inverter module 300 to the output terminal 200 through a plurality of output wires 7041, the first alternating current is transmitted to the alternating current load 2000 along a plurality of fifth cables 805 for supplying to the alternating current load 2000.

After the second differential mode current I2 output by the second photovoltaic module 900a from the second positive electrode output end 903 is transmitted to the second wiring terminal 602 along the second cable 802, the second differential mode current I2 is transmitted from the second wiring terminal 602 to the current transformer 500 along the second wire 7012. Then, after the current transformer 500 transmits the current to the first boosting unit 401 along the fifth wire 7022, the first boosting unit 401 transmits the current to the current transformer 500 sequentially along the eighth wire 7025 and the sixth wire 7023. Then, after the current transformer 500 transmits the current to the third wiring terminal 603 along the third wire 7013, the current flows back to the second negative electrode output end 904 along the fourth cable 804 from the third wiring terminal 603.

It may be understood that, both the second wire 7012 and the fifth wire 7022 transmit the second differential mode current I2 and the second common mode current I2a. The second differential mode current I2 and the second common mode current I2a transmitted in the second wire 7012 and the fifth wire 7022 have a same direction. For example, both the second differential mode current I2 and the second common mode current I2a are transmitted from the second wiring terminal 602 to the current transformer 500 along the second wire 7012, and then transmitted to the first boosting unit 401 along the fifth wire 7022. The second differential mode current I2 and the second common mode current I2a that are transmitted in the third wire 7013 and the sixth wire 7023 have opposite directions. For example, after the second differential mode current I2 is transmitted to the current transformer 500 along the sixth wire 7023, the second differential mode current I2 is transmitted to the third wiring terminal 603 along the third wire 7013; and after the second common mode current I2a is transmitted from the third wiring terminal 603 to the current transformer 500 along the third wire 7013, the second common mode current I2a is transmitted to the first boosting unit 401 and the second boosting unit 402 along the sixth wire 7023.

When the second differential mode current I2 that is output through the current transformer 500 is transmitted to the first boosting unit 401 along the fifth wire 7022, the control module 100 controls the first boosting unit 401 to perform boosting processing on the second differential mode current I2. After performing boosting processing on the second differential mode current I2, the first boosting unit 401 outputs a second boosted current. In other words, the first boosting unit 401 is configured to output the second boosted current after performing boosting processing on the second differential mode current I2. It should be noted that the second boosted current is a direct current. The second differential mode current I2 transmitted from the first boosting unit 401 to the current transformer 500 along the eighth wire 7025 and the sixth wire 7023 is not boosted.

The second boosted current is transmitted from the first boosting unit 401 to the inverter module 300 through the first subline 7031. The control module 100 controls the inverter module 300 to perform inversion processing on the second boosted current, to convert the second boosted current into a second alternating current for output. After the second alternating current is transmitted from the inverter module 300 to the output terminal 200 through the plurality of output wires 7041, the second alternating current is transmitted from the output terminal 200 to the alternating current load 2000 along the plurality of fifth cables 805 for supplying to the alternating current load 2000.

It may be understood that both the first differential mode current I1 output from the first positive electrode output end 901 and the second differential mode current I2 output from the second positive electrode output end 903 flow back to the third wiring terminal 603 along the sixth wire 7023, the third wire 7013, and the third cable 803, and then flow back to the first negative electrode output end 902 and the second negative electrode output end 904 respectively, the current transmitted in the sixth wire 7023 and the third wire 7013 includes a combined current (that is, a third differential mode current I3) of the first differential mode current I1 and the second differential mode current I2. A value of the third differential mode current I3 is equal to a sum of the value of the first differential mode current I1 and the value of the second differential mode current I2.

After the first common mode current I1a is transmitted from the third wiring terminal 603 to the current transformer 500 along the third wire 7013, the first common mode current I1a is transmitted to the first boosting unit 401 and the second boosting unit 402 along the sixth wire 7023. After the second common mode current I2a is transmitted from the third wiring terminal 603 to the current transformer 500 along the third wire 7013, the second common mode current I2a is transmitted to the first boosting unit 401 and the second boosting unit 402 along the sixth wire 7023. Both the current transmitted in the third wire 7013 and the current transmitted in the sixth wire 7023 further include a combined current (that is, the third common mode current I3a) of the first common mode current I1a and the second common mode current I2a. A value of the third common mode current I3a is equal to a sum of the value of the first common mode current I1a and the value of the second common mode current I2a. A direction of the third common mode current I3a is opposite to a direction of the third differential mode current I3.

It should be noted that, after the second differential mode current I2 and the first differential mode current I1 are boosted by using the first boosting unit 401 and the second boosting unit 402 respectively, a first ripple current exists in the first differential mode current I1 that is transmitted from the first boosting unit 401 to the current transformer 500 along the eighth wire 7025 and the sixth wire 7023, and a second ripple current exists in the second differential mode current I2 that is transmitted from the second boosting unit 402 to the current transformer 500 sequentially along the seventh wire 7024 and the sixth wire 7023. Both the first ripple current and the second ripple current are alternating currents. A phase of the first ripple current is a first initial phase, and a phase of the second ripple current is a second initial phase.

In some embodiments, the control module 100 is further configured to perform phase shift processing on the first ripple current and the second ripple current, so that phases of the first ripple current and the second ripple current are opposite or approximately opposite. For example, the control module 100 performs first phase shift processing on the first ripple current, so that the phase of the first ripple current is converted from the first initial phase to a first phase; and the control module 100 performs second phase shift processing on the second ripple current, so that the phase of the second ripple current is converted from the second initial phase to a second phase. The first phase is opposite to or approximately opposite to the second phase. In this way, the first ripple current that is transmitted from the eighth wire 7025 to the sixth wire 7023 along with the first differential mode current I1 and the second ripple current that is transmitted from the seventh wire 7024 to the sixth wire 7023 along with the second differential mode current I2 offset each other in the sixth wire 7023, so that the third differential mode current I3 transmitted in the sixth wire 7023 and the third wire 7013 is not greatly affected by a current ripple. In this way, a large quantity of ripple and noise signals do not exist in the induced current output through the current transformer 500. This avoids interference of the ripple and noise signals to detection of the arcing signal by the detection module 100a, and improves accuracy of detection of the arcing signal in the induced current by the detection module 100a.

The detection module 100a is located between the current transformer 500 and the inverter module 300, and is located on one side of the boosting module 400. For example, the detection module 100a is located on one side that is of the second boosting unit 402 and that is opposite to the first boosting unit 401. The detection module 100a is electrically connected to the current transformer 500 and the control module 100.

The seventh line 707 is located between the detection module 100a and the current transformer 500, and is connected to the detection module 100a and the current transformer 500. The seventh line 707 is configured to implement an electrical connection between the detection module 100a and the current transformer 500. For example, the seventh line 707 includes two detection wires 7071 and two self-test wires 7072. The two detection wires 7071 and the two self-test wires 7072 are sequentially spaced opposite to each other. One end of each detection wire 7071 and one end of each self-test wire 7072 are connected to the current transformer 500, and the other end of each detection wire 7071 and the other end of each self-test wire 7072 are connected to the detection module 100a. The current transformer 500 is electrically connected to the detection module 100a through the two detection wires 7071 and the two self-test wires 7072. In some other embodiments, the self-test wires 7072 may be omitted. The eighth line 708 is located between the detection module 100a and the control module 100, and is connected to the detection module 100a and the control module 100. The eighth line 708 is configured to implement an electrical connection between the detection module 100a and the control module 100.

As described above, the first differential mode current I1, the second differential mode current I2, the third differential mode current I3, the first common mode current I1a, the second common mode current I2a, and the third common mode current I3a all flow through the current transformer

500, and the current transformer 500 may output the first induced current I4 and the second induced current I5 according to the foregoing currents. The first induced current I4 is transmitted to the detection module 100a along the two detection wires 7071, and the control module 100 controls the detection module 100a to perform arcing detection on the first induced current I4. In other words, the detection module 100a is configured to perform arcing detection on the first induced current I4. If the detection module 100a detects the arcing signal, the detection module 100a outputs a control signal to the control module 100 along the eighth line 708, and the control module 100 controls the photovoltaic converter 800a to stop working.

The second induced current I5 is transmitted to the detection module 100a along the two self-test wires 7072. The control module 100 may control the detection module 100a to generate a simulated arcing signal, where the simulated arcing signal is used for self-test of the detection module 100a. In other words, the detection module 100a is further configured to generate a simulated arcing signal, where the simulated arcing signal is used for self-test of the detection module 100a. For example, after the control module 100 controls the detection module 100a to generate the simulated arcing signal, the detection module 100a may output the control signal to the control module 100, to control the photovoltaic converter 800a to stop working. In this way, it can be determined, based on the simulated arcing signal, whether the detection module 100a can work normally.

The following describes in detail the current transformer 500 provided in embodiments with reference to the accompanying drawings.

Figure 3:
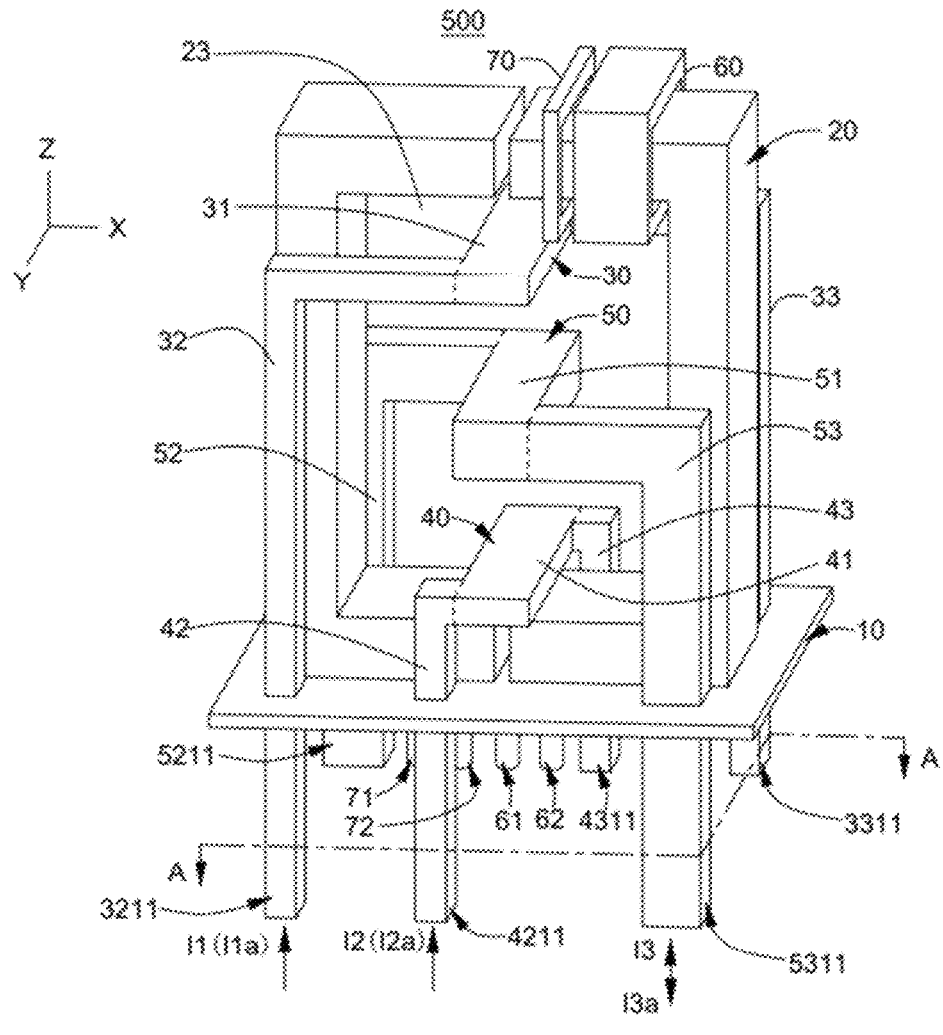
FIG. 3 is a schematic diagram of a three-dimensional structure of a current transformer according to an embodiment.

Refer to FIG. 2 and FIG. 3. FIG. 3 is a schematic diagram of a three-dimensional structure of a current transformer 500 according to an embodiment.

The current transformer 500 includes a fastener 10, a magnetic structure 20, a first positive primary side winding 30, a second positive primary side winding 40, a negative primary side winding 50, a first secondary side winding 60, and a second secondary side winding 70. The magnetic structure 20 is fastened to the fastener 10. The first positive primary side winding 30 passes through the magnetic structure 20 and is not in contact with the magnetic structure 20. The first positive primary side winding 30 is fastened to the fastener 10 through the fastener 10. The second positive primary side winding 40 passes through the magnetic structure 20 and is not in contact with the magnetic structure 20. The second positive primary side winding 40 is fastened to the fastener 10 through the fastener 10. The negative primary side winding 50 passes through the magnetic structure 20 and is not in contact with the magnetic structure 20. The negative primary side winding 50 passes through the fastener 10, and is fastened to the fastener 10. The first secondary side winding 60 is wound around the magnetic structure 20. The first secondary side winding 60 passes through the fastener 10, and is fastened to the fastener 10. The second secondary side winding 70 is wound around the magnetic structure 20. The second secondary side winding 70 is fastened to the fastener 10 through the fastener 10.

The first positive primary side winding 30 is connected to a first wire 7011 and a fifth wire 7022; the first positive primary side winding 30 is electrically connected to a first positive electrode output end 901 and a first boosting unit 401; the first positive primary side winding 30 is configured to transmit a first differential mode current I1 and a first common mode current I1a; and the first differential mode current I1 and the first common mode current I1a are transmitted from the first positive electrode output end 901 to the first boosting unit 401 through a first wiring terminal 601 and the first positive primary side winding 30. It may be understood that the first positive primary side winding 30 is electrically connected to the first positive electrode output end 901 of the first photovoltaic module 900 and the boosting module 400 of the power conversion circuit 100*b* (as shown in FIG. 1). In some other embodiments, the first positive primary side winding 30 may also be electrically connected to the first positive electrode output ends 901 of more (for example, two, three, or four) first photovoltaic modules 900.

The second positive primary side winding 40 is connected to the second wire 7012 and the fourth wire 7021; the second positive primary side winding 40 is electrically connected to the second positive electrode output end 903 and the second boosting unit 402; the second positive primary side winding 40 is configured to transmit a second differential mode current I2 and a second common mode current I2*a*; and the second differential mode current I2 and the second common mode current I2*a* are transmitted from the second positive electrode output end 903 to the second boosting unit 402 through the second wiring terminal 602 and the second positive primary side winding 40. It may be understood that the second positive primary side winding 40 is electrically connected to the second positive electrode output end 903 of the second photovoltaic module 900*a* and the boosting module 400 of the power conversion circuit 100*b*. In some other embodiments, the second positive primary side winding 40 may also be electrically connected to the second positive electrode output ends 903 of more (for example, two, three, or four) second photovoltaic modules 900*a*.

The negative primary side winding 50 is connected to the third wire 7013 and the sixth wire 7023, the negative primary side winding 50 is electrically connected to the first negative electrode output end 902, the second negative electrode output end 904, the first boosting unit 401, and the second boosting unit 402, and the negative primary side winding 50 is configured to transmit a third differential mode current I3 and a third common mode current I3*a*, the third differential mode current I3 is transmitted from the first boosting unit 401 and the second boosting unit 402 to the third wiring terminal 603 through the negative primary side winding 50; and the third common mode current I3*a* is transmitted from the third wiring terminal 603 to the first boosting unit 401 and the second boosting unit 402 through the negative primary side winding 50. It may be understood that the negative primary side winding 50 is electrically connected to the first negative electrode output end 902 of the first photovoltaic module 900, the second negative electrode output end 904 of the second photovoltaic module 900*a*, and the boosting module 400 of the power conversion circuit 100*b*.

The first secondary side winding 60 is connected to the two detection wires 7071, the first secondary side winding 60 is electrically connected to the detection module 100*a*, and the first secondary side winding 60 is configured to output a first induced current I4 by coupling based on currents transmitted in the first positive primary side winding 30, the second positive primary side winding 40, and the negative primary side winding 50, for example, output the first induced current I4 according to a sum of magnetic fluxes. The second secondary side winding 70 is connected to the two self-test wires 7072, the second secondary side winding 70 is electrically connected to the detection module 100*a*, and the second secondary side winding 70 is configured to output a second induced current I5 by coupling based on currents transmitted in the first positive primary side winding 30, the second positive primary side winding 40, and the negative primary side winding 50, for example, output the second induced current I5 according to a sum of magnetic fluxes. It should be noted that the sum of magnetic fluxes is a sum of the magnetic fluxes generated by the first differential mode current I1, the second differential mode current I2, the third differential mode current I3, the first common mode current I1*a*, the second common mode current I2*a*, and the third common mode current I3*a* in the magnetic structure 20.

It may be understood that there is one first positive primary side winding 30 and one second positive primary side winding 40. In some other embodiments, there may be more (for example, two, three, four, or five) first positive primary side windings 30 and second positive primary side windings 40. For example, each first positive primary side winding 30 may be electrically connected to a first positive electrode output end 901 of one first photovoltaic module 900, and each second positive primary side winding 40 may be electrically connected to a second positive electrode output end 903 of one second photovoltaic module 900*a*. There are two secondary side windings: a first secondary side winding 60 and a second secondary side winding 70. In some other embodiments, there may be one or more (for example, three, four, or five) secondary side windings. The quantity of secondary side windings is not limited.

Figure 4:
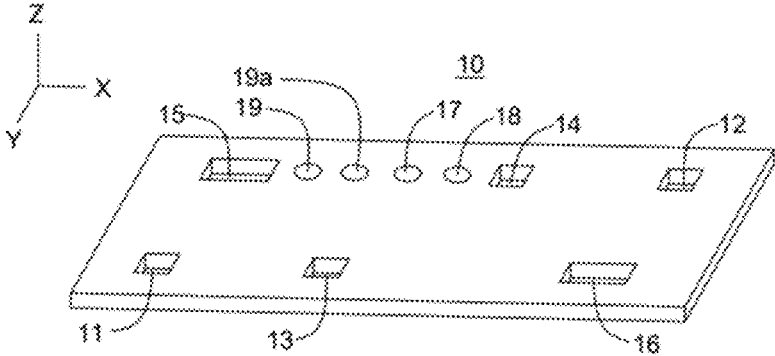
FIG. 4 is a schematic diagram of a three-dimensional structure of a fastener in the current transformer shown in FIG. 3.

Refer to FIG. 3 and FIG. 4. FIG. 4 is a schematic diagram of a three-dimensional structure of the fastener 10 in the current transformer 500 shown in FIG. 3.

For example, the fastener 10 is a rectangular plate body. For case of description below, a length direction of the fastener 10 is defined as a first direction (an X-axis direction shown in the figure), a width direction of the fastener 10 is defined as a second direction (a Y-axis direction shown in the figure), and a thickness direction of the fastener 10 is defined as a third direction (a Z-axis direction shown in the figure). The fastener 10 is made of an insulation material, for example, plastic or epoxy resin. In some other embodiments, the fastener 10 may also be an abnormal-shaped plate such as a circular plate or a triangular plate. This is not limited.

The fastener 10 is provided with a plurality of through-holes. In the Z-axis direction, each through-hole runs through the fastener 10. In some embodiments, the plurality of through-holes include a first through-hole 11, a second through-hole 12, a third through-hole 13, a fourth through-hole 14, a fifth through-hole 15, a sixth through-hole 16, a seventh through-hole 17, an eighth through-hole 18, a ninth through-hole 19, and a tenth through-hole 19*a*. The first through-hole 11, the second through-hole 12, the third through-hole 13, the fourth through-hole 14, the fifth through-hole 15, and the sixth through-hole 16 are rectangular holes, and the seventh through-hole 17, the eighth through-hole 18, the ninth through-hole 19, and the tenth through-hole 19*a* are circular holes.

Areas of the first through-hole 11 and the second through-hole 12 are equal. Areas of the third through-hole 13 and the fourth through-hole 14 are equal, and are equal to the areas of the first through-hole 11 and the second through-hole 12. In some other embodiments, the foregoing related areas may be unequal. Areas of the fifth through-hole 15 and the sixth through-hole 16 are equal, and are equal to a sum of an area of the first through-hole 11 and an area of the third through-hole 13. Areas of the seventh through-hole 17 and the eighth through-hole 18 are equal. Areas of the ninth through-hole 19 and the tenth through-hole 19*a* are equal, and are equal to the areas of the seventh through-hole 17 and the eighth through-hole 18. In some other embodiments, the foregoing related areas may be unequal. It should be noted that a specific tolerance range is also allowed for the foregoing equality.

In the X-axis direction, the first through-hole 11, the third through-hole 13, and the sixth through-hole 16 are sequentially arranged at intervals, and the third through-hole 13 is located between the first through-hole 11 and the sixth through-hole 16. In the Y-axis direction, the second through-hole 12 and the first through-hole 11 are spaced and disposed in a staggered manner, and are located on one side of the sixth through-hole 16.

It should be noted that, in the Y-axis direction, that a feature A and a feature B are disposed in a staggered manner means that projections of the feature A and the feature B on the X-Z plane do not overlap. In the X-axis direction, that the feature A and the feature B are set in a staggered manner means that projections of the feature A and the feature B on the Y-Z plane do not overlap. In the Z-axis direction, staggered disposition of the feature A and the feature B means that projections of the feature A and the feature B on the X-Y plane do not overlap. The following description about the staggered disposition may be understood in the same way, and details are not described again.

In the Y-axis direction, the fourth through-hole 14 and the third through-hole 13 are spaced and disposed in a staggered manner; and in an X-axis direction, the fourth through-hole 14 is located between the third through-hole 13 and the sixth through-hole 16, is located on one side that is of the second through-hole 12 and that faces the third through-hole 13, and is spaced from the second through-hole 12. In the Y-axis direction, a spacing between the fourth through-hole 14 and the third through-hole 13 and a spacing between the second through-hole 12 and the first through-hole 11 are equal. In some other embodiments, the foregoing related spacings may be unequal.

In the Y-axis direction, the fifth through-hole 15 and the sixth through-hole 16 are spaced from each other in a staggered manner, and are located on one side of the first through-hole 11. In addition, in the X-axis direction, the fifth through-hole 15 is located on one side that is of the third through-hole 13 and that faces the first through-hole 11, is located on one side that is of the fourth through-hole 14 and that is opposite to the second through-hole 12, and is spaced from the fourth through-hole 14. In the Y-axis direction, a spacing between the fifth through-hole 15 and the sixth through-hole 16, a spacing between the first through-hole 11 and the second through-hole 12, and a spacing between the third through-hole 13 and the fourth through-hole 14 are equal. In some other embodiments, the foregoing related spacings may be unequal.

In the X-axis direction, the ninth through-hole 19, the tenth through-hole 19a, the seventh through-hole 17, and the eighth through-hole 18 are sequentially arranged between the fifth through-hole 15 and the fourth through-hole 14. The ninth through-hole 19 and the fifth through-hole 15 are spaced, the eighth through-hole 18 is located on one side that is of the ninth through-hole 19 and that is opposite to the fifth through-hole 15, and the eighth through-hole 18 and the fourth through-hole 14 are spaced.

Figure 5:
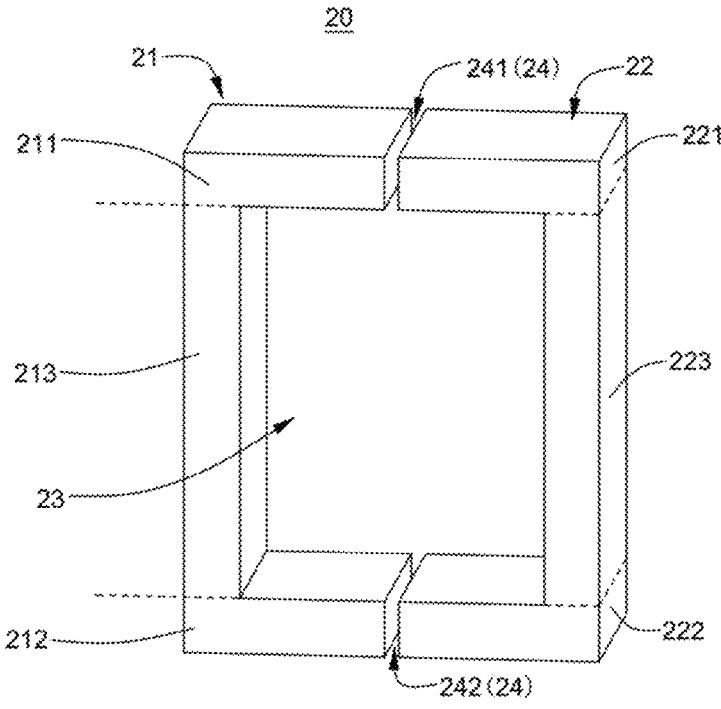
FIG. 5 is a schematic diagram of a three-dimensional structure of a magnetic structure of the current transformer shown in FIG. 3.
Figure 6:
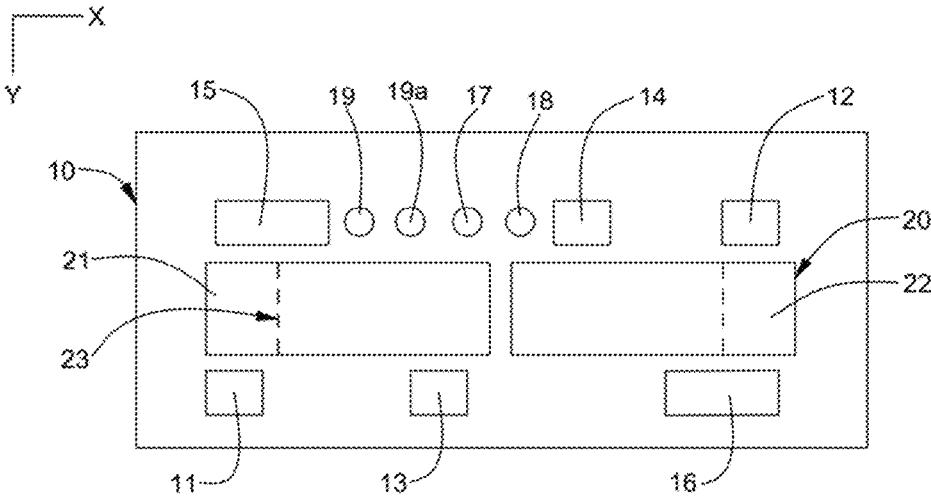
FIG. 6 is a schematic diagram of structures of the fastener and the magnetic structure in the current transformer shown in FIG. 3 from another angle.

Refer to FIG. 3, FIG. 5, and FIG. 6. FIG. 5 is a schematic diagram of a three-dimensional structure of the magnetic structure 20 in the current transformer 500 shown in FIG. 3. FIG. 6 is a schematic diagram of structures of the magnetic structure 20 and the fastener 10 in the current transformer 500 shown in FIG. 3 from another angle.

The magnetic structure 20 is fastened to the fastener 10. In some embodiments, the magnetic structure 20 is fixedly stacked on a surface of the fastener 10. The magnetic structure 20 is fastened to the fastener 10 through glue bonding, welding, or the like. This is not limited. For example, the magnetic structure 20 is a rectangular frame. The magnetic structure 20 is made of a soft magnetic material. The soft magnetic material includes, but is not limited to, soft iron, a soft magnetic alloy, a ferrite material, a steel silicon sheet, and the like. This is not limited. In some other embodiments, the magnetic structure 20 may also be frame bodies of various shapes such as an annular frame body and a diamond frame body. In this embodiment, a height direction of the magnetic structure 20 is parallel to a Z-axis direction, a length direction of the magnetic structure 20 is parallel to an X-axis direction, and a width direction of the magnetic structure 20 is parallel to a Y-axis direction.

The magnetic structure 20 includes a first magnetic core 21 and a second magnetic core 22. The first magnetic core 21 and the second magnetic core 22 are disposed opposite to each other. The first magnetic core 21 and the second magnetic core 22 are enclosed to form a traversing channel 23. The first magnetic core 21 and the second magnetic core 22 are spaced from each other and have an air gap 24. In some other embodiments, the first magnetic core 21 and the second magnetic core 22 may also be integrated into one, to enhance overall strength of the magnetic structure 20, that is, the air gap 24 may be omitted. The first magnetic core 21 and the second magnetic core 22 in this embodiment are roughly U-shaped block structures.

It may also be understood that the magnetic structure 20 has a traversing channel 23, and the traversing channel 23 extends in a thickness direction of the magnetic structure 20. The magnetic structure 20 is provided with an air gap 24, there are two air gaps 24 (the first air gap 241 and the second air gap 242), and the air gap 24 communicates with the traversing channel 23. The design of the air gap 24 effectively reduces a magnetic permeability of the magnetic structure 20, effectively increases a saturation magnetization intensity of the magnetic structure 20, and avoids a magnetic saturation phenomenon in a working process of the magnetic structure 20. In addition, the structure is simple, and is easy to design.

In some embodiments, the first magnetic core 21 includes a first magnet 211, a second magnet 212, and a third magnet 213. The first magnet 211 and the second magnet 212 are disposed in parallel and opposite to each other, and both the first magnet 211 and the second magnet 212 are located on one side of the third magnet 213 and are connected to the third magnet 213. The third magnet 213 is disposed vertical to both the first magnet 211 and the second magnet 212. One end part of the third magnet 213 is connected to one end part of the first magnet 211, and the other end part thereof is connected to one end part of the second magnet 212. The first magnetic core 21 disposed in such a way has a stable structure and high strength. It should be noted that, that a feature A is disposed vertical to a feature B means that a geometric center line of the feature A is vertical to a geometric center line of the feature B (a specific tolerance range is also allowed). For descriptions about vertical disposition in the following, refer to the foregoing descriptions. Details are not described again. That the feature A and the feature B are disposed in parallel and opposite to each other means that a geometric center line of the feature A is parallel to a geometric center line of the feature B (a specific tolerance range is also allowed), and the feature A and the feature B are spaced. For descriptions of parallel and opposite disposition in the following, refer to the foregoing descriptions. Details are not described again.

The second magnetic core 22 includes a fourth magnet 221, a fifth magnet 222, and a sixth magnet 223. The fourth magnet 221 and the fifth magnet 222 are disposed in parallel and opposite to each other, and both the fourth magnet 221 and the fifth magnet 222 are located on one side of the sixth magnet 223 and are connected to the sixth magnet 223. The sixth magnet 223 is disposed vertical to both the fourth magnet 221 and the fifth magnet 222. One end part of the sixth magnet 223 is connected to one end part of the fourth magnet 221, and the other end part thereof is connected to one end part of the fifth magnet 222. The second magnetic core 22 disposed in such a way has a stable structure and high strength.

The first magnetic core 21 is fixedly stacked on the fastener 10. For example, the second magnet 212 is fixedly stacked on a surface of the fastener 10, a length direction of the second magnet 212 and a length direction of the first magnet 211 are parallel to an X-axis direction, and a length direction of the third magnet 213 is parallel to a Z-axis direction. In a Y-axis direction, the first through-hole 11 and the third through-hole 13 are located on one side of the second magnet 212; and the fifth through-hole 15, the ninth through-hole 19, the tenth through-hole 19a, and the seventh through-hole 17 are located on the other side of the second magnet 212. In the X-axis direction, the eighth through-hole 18 is located at one end that is of the second magnet 212 and that is opposite to the third magnet 213.

The second magnetic core 22 is fixedly stacked on the fastener 10, and is spaced opposite to the first magnetic core 21. For example, the fifth magnet 222 is fixedly stacked on a surface of the fastener 10, and is spaced opposite to the second magnet 212. A length direction of the fifth magnet 222 and a length direction of the fourth magnet 221 are parallel to an X-axis direction, and a length direction of the sixth magnet 223 is parallel to a Z-axis direction. In the Y-axis direction, the sixth through-hole 16 is located on one side of the fifth magnet 222, and the eighth through-hole 18, the fourth through-hole 14; and the second through-hole 12 are located on the other side of the fifth magnet 222. In the X-axis direction, the second magnet 212 is located at one end that is of the fifth magnet 222 and that is opposite to the sixth magnet 223, and is spaced from the second magnet 212 and has the second air gap 242. The fourth magnet 221 is spaced from the first magnet 211 and has the first air gap 241. The second magnetic core 22 and the first magnetic core 21 are enclosed to form the traversing channel 23, and the traversing channel 23 extends in the Y-axis direction.

A length of the first air gap 241 is equal to a length of the second air gap 242 in the X-axis direction. In some other embodiments, the length of the first air gap 241 may be not equal to the length of the second air gap 242. It should be noted that the feature A and the feature B are spaced and have an air gap, and the length of the air gap is a distance between the feature A and the feature B.

In this way, lengths of the first air gap 241 and the second air gap 242 may be changed by changing relative positions of the first magnetic core 21 and the second magnetic core 22 on the fastener 10, so that magnetic permeability and saturation magnetization intensity of the magnetic structure 20 are changed. Therefore, the magnetic permeability and saturation magnetization intensity of the magnetic structure 20 can be changed according to a need or desire, so as to avoid magnetic saturation of the magnetic structure 20 in a working process. For example, a greater length of the first air gap 241 and a greater length of the second air gap 242 (that is, a larger spacing between the first magnetic core 21 and the second magnetic core 22 in the X-axis direction) indicates lower magnetic permeability of the magnetic structure 20, higher saturation magnetization intensity, and a less likely magnetic saturation phenomenon. This simplifies adjustment, and avoids a plurality of times of processing the first magnetic core 21 and the second magnetic core 22, thereby reducing processing costs. In some other embodiments, there may be one or more (for example, three, four, or five) air gaps 24. The air gap 24 may be disposed at any position of the magnetic structure 20. In other words, neither the quantity, nor the position, of the air gaps 24 is limited.

Figure 7:
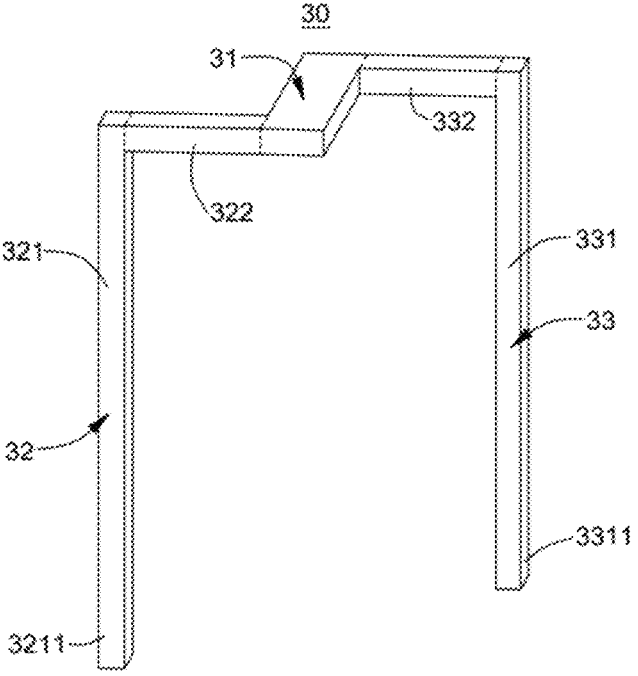
FIG. 7 is a schematic diagram of a three-dimensional structure of a first positive primary side winding in the current transformer shown in FIG. 3.

Refer to FIG. 3, FIG. 6, and FIG. 7. FIG. 7 is a schematic diagram of a three-dimensional structure of the first positive primary side winding 30 in the current transformer 500 shown in FIG. 3.

The first positive primary side winding 30 passes through a magnetic structure 20. The first positive primary side winding 30 penetrates into a fastener 10. In some embodiments, the first positive primary side winding 30 passes through a traversing channel 23. Two end parts of the first positive primary side winding 30 respectively penetrate into a first through-hole 11 and a second through-hole 12. One end part of the first positive primary side winding 30 is located on one side of the magnetic structure 20, and the other end part thereof is located on the other side of the magnetic structure 20. For example, the first positive primary side winding 30 is a metal strip, and can be a copper strip. In some other embodiments, the first positive primary side winding 30 may alternatively be made of another conductive metal or another material such as aluminum or silver. This is not limited.

In some embodiments, the first positive primary side winding 30 includes a first connection part 31, a second connection part 32, and a third connection part 33. The second connection part 32 and the third connection part 33 are disposed in parallel and opposite to each other and are located on two opposite sides of the first connection part 31, and the second connection part 32 and the third connection part 33 are respectively connected to two opposite end parts of the first connection part 31. In other words, in an extension direction of the first connection part 31, the second connection part 32 and the third connection part 33 are disposed in a staggered manner. It should be noted that, in the embodiments, that a feature A and a feature B are disposed in a staggered manner in a direction means that a projection of the feature A on a plane vertical to the direction does not overlap a projection of the feature B on the plane vertical to the direction.

The second connection part 32 includes a first part 321 and a second part 322. The first part 321 includes a first end part 3211. An end part that is of the first part 321 and that is opposite to the first end part 3211 is connected to an end part of the second part 322, and the first part 321 is disposed vertical to the second part 322. An end part that is of the second part 322 and that is opposite to the first part 321 is connected to an end part of the first connection part 31. The first connection part 31 is disposed vertical to both the first part 321 and the second part 322. It may be understood that an end part that is of the second connection part 32 and that is opposite to the first connection part 31 is the first end part 3211. A cross-sectional shape of the first end part 3211 is a rectangle, and a cross-sectional area of the first end part 3211 is equal to an area of the first through-hole 11. A specific tolerance range is allowed for the equality.

The third connection part 33 includes a third part 331 and a fourth part 332. The third part 331 includes a second end part 3311. An end part of the third part 331 that is opposite to the second end part 3311 is connected to an end part of the fourth part 332. The third part 331 is disposed vertical to the fourth part 332. Both the third part 331 and the fourth part 332 are located on one side that is of the first connection part 31 and that is opposite to the second part 322, and an end part that is of the fourth part 332 and that is opposite to the third part 331 is connected to the other end part of the first connection part 31. The first connection part 31 is disposed vertical to both the third part 331 and the fourth part 332. It may be understood that an end part that is of the third connection part 33 and that is opposite to the first connection part 31 is the second end part 3311.

A cross-sectional shape of the second end part 3311 is a rectangle, and a cross-sectional area of the second end part 3311 is equal to a cross-sectional area of the first end part 3211 (a specific tolerance range is also allowed). In some other embodiments, the foregoing related cross-sectional areas may be unequal. A cross-sectional area of the second end part 3311 is equal to an area of the second through-hole 12. It should be noted that the cross-sectional area of a feature A is a projection area of the feature A on an X-Y plane. For descriptions of the cross-sectional area in the following, refer to the foregoing descriptions. Details are not described again.

The first connection part 31 passes through the magnetic structure 20; the second connection part 32 is located on one side of the magnetic structure 20 and penetrates into the fastener 10; and the third connection part 33 is located on the other side of the magnetic structure 20 and penetrates into the fastener 10. In other words, the second connection part 32 and the third connection part 33 are located on two opposite sides of the magnetic structure 20. For example, the first connection part 31 passes through the traversing channel 23, and a length direction of the first connection part 31 is parallel to a Y-axis direction. In other words, the first connection part 31 extends in an extension direction of the traversing channel 23.

The first part 321 and the second part 322 are located on one side of the magnetic structure 20, and a length direction of the second part 322 is parallel to an X-axis direction. A length direction of the first part 321 is parallel to a Z-axis direction. The first part 321 penetrates into the first through-hole 11 of the fastener 10 through glue bonding, welding, interference fitting, or the like. The first end part 3211 is located on one side that is of the fastener 10 and that is opposite to the magnetic structure 20. It may be understood that the second connection part 32 extends in the height direction of the magnetic structure 20.

The third part 331 and the fourth part 332 are located on the other side of the magnetic structure 20, and a length direction of the fourth part 332 is parallel to an X-axis direction. A length direction of the third part 331 is parallel to a Z-axis direction. The third part 331 penetrates into the second through-hole 12 of the fastener 10 through glue bonding, welding, interference fitting, or the like. The second end part 3311 is located on one side that is of the fastener 10 and that is opposite to the magnetic structure 20. It may be understood that the third connection part 33 extends in the height direction of the magnetic structure 20. In an extension direction of the traversing channel 23, the first end part 3211 and the second end part 3311 are located at two opposite ends of the first connection part 31.

It may be understood that the first positive primary side winding 30 includes a first end part 3211 and a second end part 3311; the first positive primary side winding 30 passes through the traversing channel 23 and penetrates into the fastener 10; and the first end part 3211 and the second end part 3311 are located on two opposite sides of the magnetic structure 20, and are both located on one side that is of the fastener 10 and that is opposite to the magnetic structure 20.

Figure 8:
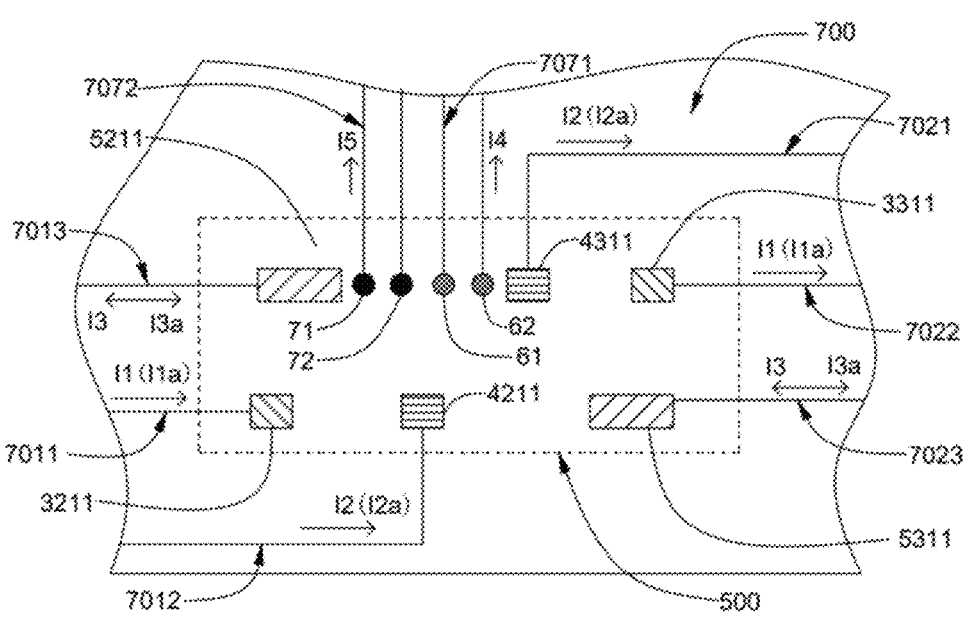
FIG. 8 is a schematic diagram of a partial structure that is obtained by cutting along a line A-A after the current transformer shown in FIG. 3 fits with a circuit board.

Refer to FIG. 2, FIG. 3, and FIG. 8. FIG. 8 is a schematic diagram of a partial structure that is obtained by cutting along a line A-A after the current transformer 500 shown in FIG. 3 fits with a circuit board 700.

A first positive primary side winding 30 is connected to the circuit board 700. For example, a first end part 3211 of the first positive primary side winding 30 is connected to a first wire 7011, and a second end part 3311 is connected to a fifth wire 7022. The first end part 3211 and the second end part 3311 are respectively connected to the first wire 7011 and the fifth wire 7022 in a manner including, but not limited to, welding. For example, a first plug hole (not shown in the figure) and a second plug hole are respectively disposed at end parts of the first wire 7011 and the fifth wire 7022 of the circuit board 700; a metal layer is plated on a hole wall of each plug hole; and the first end part 3211 and the second end part 3311 are respectively inserted and welded into the first plug hole and the second plug hole. Therefore, the first end part 3211 is electrically connected and fastened to the first wire 7011, and the second end part 3311 is electrically connected and fastened to the fifth wire 7022. In other words, the circuit board 700 is fastened to and electrically connected to the first end part 3211 and the second end part 3311.

It may be understood that the first end part 3211 is electrically connected to a first positive electrode output end 901 of a first photovoltaic module 900, and the second end part 3311 is electrically connected to a first boosting unit 401, that is, electrically connected to a boosting module 400 and an inverter module 300, that is, electrically connected to the power conversion circuit 100*b* (as shown in FIG. 1). A first differential mode current I1 is transmitted from the first end part 3211 to the first positive primary side winding 30 through the first wire 7011. Then, after passing through the traversing channel 23 of the magnetic structure 20 along the first connection part 31 of the first positive primary side winding 30, the first differential mode current I1 is transmitted from the second end part 3311 to the fifth wire 7022, and then is transmitted to the first boosting unit 401 along the fifth wire 7022.

A first common mode current I1*a* is transmitted from the first end part 3211 to the first positive primary side winding 30 through the first wire 7011. Then, after passing through the traversing channel 23 of the magnetic structure 20 along the first connection part 31 of the first positive primary side winding 30, the first common mode current I1*a* is transmitted from the second end part 3311 to the fifth wire 7022. It may be understood that the first positive primary side winding 30 is configured to transmit the first differential mode current I1 and the first common mode current I1*a*. Both the first differential mode current I1 and the first common mode current I1*a* flow from the first end part 3211 to the second end part 3311, and the first differential mode current I1 and the first common mode current I1*a* are transmitted in a same direction in the first connection part 31.

Figure 9:
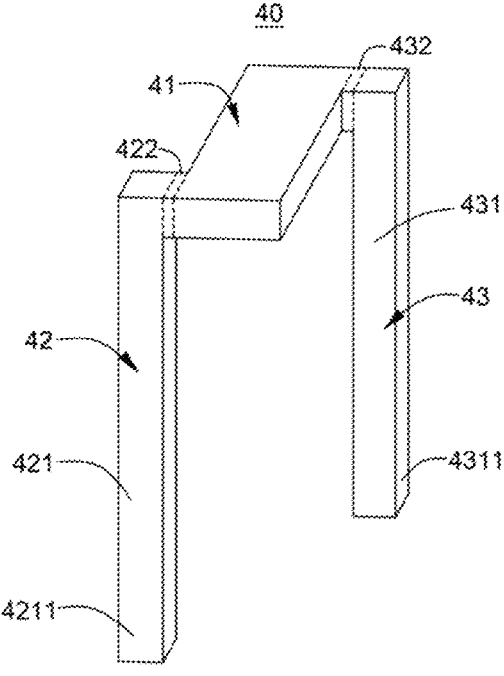
FIG. 9 is a schematic diagram of a three-dimensional structure of a second positive primary side winding in the current transformer shown in FIG. 3.

Refer to FIG. 3, FIG. 6, and FIG. 9. FIG. 9 is a schematic diagram of a three-dimensional structure of the second positive primary side winding 40 in the current transformer 500 shown in FIG. 3.

The second positive primary side winding 40 passes through a magnetic structure 20. The second positive primary side winding 40 penetrates into a fastener 10, and is spaced from a first positive primary side winding 30. In some embodiments, the second positive primary side winding 40 passes through a traversing channel 23, and is spaced from the first positive primary side winding 30; and two end parts of the second positive primary side winding 40 respectively penetrate into a third through-hole 13 and a fourth through-hole 14. One end part of the second positive primary side winding 40 is located on one side that is of the magnetic structure 20 and that faces a first end part 3211, and is spaced from the first end part 3211; and the other end part thereof is located on one side that is of the magnetic structure 20 and that faces a second end part 3311, and is spaced from the second end part 3311. In a Y-axis direction, the second positive primary side winding 40 is partially covered by the first positive primary side winding 30. For example, the second positive primary side winding 40 is a metal strip, and can be a copper strip. In some other embodiments, the second positive primary side winding 40 may alternatively be made of another conductive metal or another material such as aluminum or silver. This is not limited.

It should be noted that, that a feature A is covered by a feature B in the Y-axis direction means that projections of the feature A and the feature B on the X-Z plane at least partially overlap. For descriptions about the covering in the following, refer to the foregoing descriptions. Details are not described again. In some other embodiments, the second positive primary side winding 40 may not be covered by the first positive primary side winding 30, or the second positive primary side winding 40 may cover the first positive primary side winding 30, or there is no covering relationship between the second positive primary side winding 40 and the first positive primary side winding 30.

In some embodiments, the second positive primary side winding 40 includes a first fastening part 41, a second fastening part 42, and a third fastening part 43. The second fastening part 42 and the third fastening part 43 are disposed in parallel and opposite to each other and are located on two opposite sides of the first fastening part 41, and the second fastening part 42 and the third fastening part 43 are respectively connected to two opposite end parts of the first fastening part 41. In other words, the second fastening part 42 and the third fastening part 43 are disposed in a staggered manner in an extension direction of the first fastening part 41.

The second fastening part 42 includes a first subpart 421 and a second subpart 422. The first subpart 421 includes a third end part 4211. An end part that is of the first subpart 421 and that is opposite to the third end part 4211 is connected to an end part of the second subpart 422. The first subpart 421 is disposed vertical to the second subpart 422. An end part that is of the second subpart 422 and that is opposite to the first subpart 421 is connected to an end part of the first fastening part 41, and the first fastening part 41 is vertical to both the first subpart 421 and the second subpart 422. It may be understood that an end part that is of the second fastening part 42 and that is opposite to the first fastening part 41 is the third end part 4211. A cross-sectional shape of the third end part 4211 is a rectangle, and a cross-sectional area of the third end part 4211 is equal to an area of the third through-hole 13. A specific tolerance range is allowed for the equality.

The third fastening part 43 includes a third subpart 431 and a fourth subpart 432. The third subpart 431 includes a fourth end part 4311. An end part that is of the third subpart 431 and that is opposite to the fourth end part 4311 is connected to an end part of the fourth subpart 432. The third subpart 431 is disposed vertical to the fourth subpart 432. Both the third subpart 431 and the fourth subpart 432 are located on one side that is of the first fastening part 41 and that is opposite to the second subpart 422, and an end part that is of the fourth subpart 432 and that is opposite to the third subpart 431 is connected to the other end part of the first fastening part 41. The first fastening part 41 is disposed vertical to both the third subpart 431 and the fourth subpart 432. It may be understood that an end part that is of the third fastening part 43 and that is opposite to the first fastening part 41 is the fourth end part 4311.

A cross-sectional shape of the fourth end part 4311 is a rectangle, and a cross-sectional area of the fourth end part 4311 is equal to a cross-sectional area of the third end part 4211 (a specific tolerance range is also allowed). In some other embodiments, the foregoing related cross-sectional areas may be unequal. A cross-sectional area of the fourth end part 4311 is equal to an area of the fourth through-hole 14.

The first fastening part 41 passes through the magnetic structure 20, and is spaced from the first connection part 31. The second fastening part 42 is located on one side that is of the magnetic structure 20 and that faces the second connection part 32, is spaced from the second connection part 32, and penetrates into the fastener 10. The third fastening part 43 is located on one side that is of the magnetic structure 20 and that faces the third connection part 33, is spaced from the third connection part 33, and penetrates into the fastener 10. For example, the first fastening part 41 passes through the traversing channel 23, and a length direction of the first fastening part 41 is parallel to a Y-axis direction. In other words, the first fastening part 41 extends in an extension direction of the traversing channel 23. In a Z-axis direction, the first fastening part 41 and the first connection part 31 are spaced from each other; and in a Z-axis direction, a projection of the first fastening part 41 overlaps a projection of the first connection part 31.

Both the first subpart 421 and the second subpart 422 are located on one side that is of the magnetic structure 20 and that faces the second connection part 32. A length direction of the second subpart 422 is parallel to an X-axis direction; and in a Z-axis direction, the second subpart 422 is located on one side of the second part 322, and is spaced from the second part 322 (as shown in FIG. 7). A length direction of the first subpart 421 is parallel to the Z-axis direction; and in the X-axis direction, the first subpart 421 is located on one side of the first part 321, and is spaced from the first part 321. The first subpart 421 penetrates into the third through-hole 13 of the fastener 10 through glue bonding, welding, interference fitting, or the like. The third end part 4211 is located on one side that is of the fastener 10 and that is opposite to the magnetic structure 20. The third end part 4211 is located on one side of the first end part 3211, and is spaced from the first end part 3211. It may be understood that the second fastening part 42 extends in a height direction of the magnetic structure 20. In the extension direction of the traversing channel 23, the third end part 4211 is located at one end that is of the first fastening part 41 and that faces the first end part 3211.

The third subpart 431 and the fourth subpart 432 are located on one side that is of the magnetic structure 20 and that faces the third connection part 33. A length direction of the fourth subpart 432 is parallel to an X-axis direction; and in a Z-axis direction, the fourth subpart 432 is located on one side of the fourth part 332, and is spaced from the fourth part 332. A length direction of the third subpart 431 is parallel to the Z-axis direction; and in the X-axis direction, the third subpart 431 is located on one side of the third part 331, and is spaced from the third part 331. The third subpart 431 penetrates into the fourth through-hole 14 of the fastener 10 through glue bonding, welding, interference fitting, or the like, and the fourth end part 4311 is located on one side that is of the fastener 10 and that is opposite to the magnetic structure 20. In addition, the fourth end part 4311 is located on one side of the second end part 3311, and is spaced from the second end part 3311. It may be understood that the third fastening part 43 extends in a height direction of the magnetic structure 20. In the extension direction of the traversing channel 23, the fourth end part 4311 is located at the other end that is of the first fastening part 41 and that faces the second end part 3311. In a Y-axis direction (that is, in the extension direction of the traversing channel 23), a spacing between the third end part 4211 and the fourth end part 4311 is equal to a spacing between the first end part 3211 and the second end part 3311.

It may be understood that the second positive primary side winding 40 includes a third end part 4211 and a fourth end part 4311, and the second positive primary side winding 40 passes through the traversing channel 23, is spaced from the first positive primary side winding 30, and penetrates into the fastener 10. The third end part 4211 is located on one side that is of the magnetic structure 20 and that faces the first end part 3211, and the fourth end part 4311 is located on one side that is of the magnetic structure 20 and that faces the second end part 3311. In addition, the first end part 3211, the second end part 3311, the third end part 4211, and the fourth end part 4311 are all located on one side that is of the fastener 10 and that is opposite to the magnetic structure 20.

Refer to FIG. 2, FIG. 3, and FIG. 8. The second positive primary side winding 40 is connected to a circuit board 700. In some embodiments, the third end part 4211 of the second positive primary side winding 40 is connected to a second wire 7012, and a fourth end part 4311 is connected to a fourth wire 7021. The third end part 4211 and the fourth end part 4311 are respectively connected to the second wire 7012 and the fourth wire 7021 in a manner including, but not limited to, welding. For example, a third plug hole (not shown in the figure) and a fourth plug hole are disposed at end parts of the second wire 7012 and the fourth wire 7021 of the circuit board 700; a metal layer is plated on a hole wall of each plug hole; and the third end part 4211 and the fourth end part 4311 are respectively inserted and welded into the third plug hole and the fourth plug hole. Therefore, the third end part 4211 is electrically connected and fastened to the second wire 7012, and the fourth end part 4311 is electrically connected and fastened to the fourth wire 7021. In other words, the circuit board 700 is fastened to and electrically connected to the third end part 4211 and the fourth end part 4311.

It may be understood that the third end part 4211 is electrically connected to a second positive electrode output end 903 of a second photovoltaic module 900a, and the fourth end part 4311 is electrically connected to a second boosting unit 402, that is, electrically connected to a boosting module 400 and an inverter module 300, that is, electrically connected to the power conversion circuit 100b (as shown in FIG. 1). A second differential mode current I2 is transmitted from the third end part 4211 to the second positive primary side winding 40 through the second wire 7012. Then, after passing through the traversing channel 23 of the magnetic structure 20 along the first fastening part 41 of the second positive primary side winding 40, the second differential mode current I2 is transmitted from the fourth end part 4311 to the fourth wire 7021, and then is transmitted to the second boosting unit 402 along the fourth wire 7021.

A second common mode current I2a is transmitted from the third end part 4211 to the second positive primary side winding 40 through the second wire 7012; and then, after passing through the traversing channel 23 of the magnetic structure 20 along the first fastening part 41 of the second positive primary side winding 40, the second common mode current I2a is transmitted from the fourth end part 4311 to the fourth wire 7021. It may be understood that the second positive primary side winding 40 is configured to transmit the second differential mode current I2 and the second common mode current I2a. Both the second differential mode current I2 and the second common mode current I2a flow from the third end part 4211 to the fourth end part 4311, and the second differential mode current I2 and the second common mode current I2a are transmitted in a same direction in the first fastening part 41.

Figure 10:
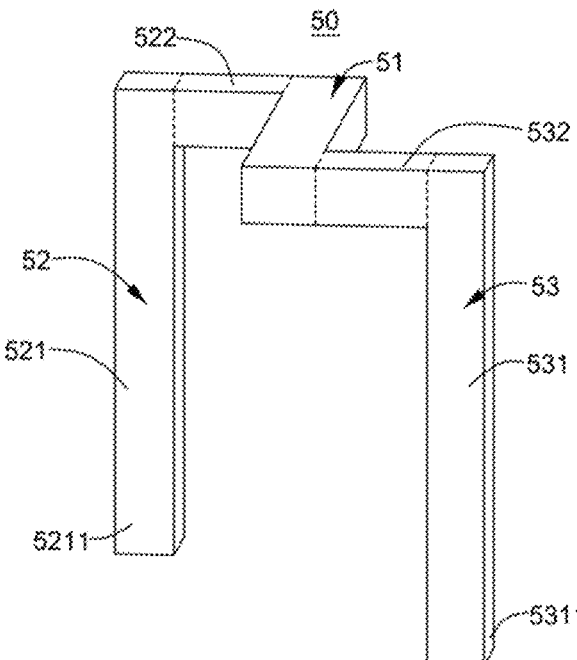
FIG. 10 is a schematic diagram of a three-dimensional structure of a negative primary side winding in the current transformer shown in FIG. 3.

Refer to FIG. 3, FIG. 6, and FIG. 10. FIG. 10 is a schematic diagram of a three-dimensional structure of the negative primary side winding 50 in the current transformer 500 shown in FIG. 3.

The negative primary side winding 50 passes through the magnetic structure 20. The negative primary side winding 50 penetrates into the fastener 10, and is spaced from the first positive primary side winding 30 and the second positive primary side winding 40. In some embodiments, the negative primary side winding 50 passes through the traversing channel 23, and is spaced from the first positive primary side winding 30 and the second positive primary side winding 40. Two end parts of the negative primary side winding 50 respectively penetrate into a fifth through-hole 15 and a sixth through-hole 16. One end part of the negative primary side winding 50 is located on one side that is of a magnetic structure 20 and that faces a first end part 3211 and a third end part 4211, and is spaced from the first end part 3211 and the third end part 4211; and the other end part thereof is located on one side that is of the magnetic structure 20 and that faces a second end part 3311 and a fourth end part 4311, and is spaced from the second end part 3311 and the fourth end part 4311. In a Y-axis direction, the negative primary side winding 50 is located between the first positive primary side winding 30 and the second positive primary side winding 40. The negative primary side winding 50 covers a part of the second positive primary side winding 40, and a part of the negative primary side winding 50 is covered by the first positive primary side winding 30. For example, the negative primary side winding 50 is a metal strip, and can be a copper strip. In some other embodiments, the negative primary side winding 50 may alternatively be made of another conductive metal or another material such as aluminum or silver. This is not limited.

In some other embodiments, in the Y-axis direction, the negative primary side winding 50 is located on one side that is of the first positive primary side winding 30 and that is away from the second positive primary side winding 40, or the negative primary side winding 50 may be located on one side that is of the second positive primary side winding 40 and that is away from the first positive primary side winding 30.

In some embodiments, the negative primary side winding 50 includes a first conductive part 51, a second conductive part 52, and a third conductive part 53. The second conductive part 52 and the third conductive part 53 are disposed in parallel and opposite to each other, and are located on two opposite sides of the first conductive part 51. The second conductive part 52 and the third conductive part 53 are respectively connected to two opposite end parts of the first conductive part 51.

The second conductive part 52 includes a first branch 521 and a second branch 522. The first branch 521 includes a fifth end part 5211. An end part that is of the first branch 521 and that is opposite to the fifth end part 5211 is connected to an end part of the second branch 522. The first branch 521 is disposed vertical to the second branch 522. An end part that is of the second branch 522 and that is opposite to the first branch 521 is connected to an end part of the first conductive part 51, and the first conductive part 51 is disposed vertical to both the first branch 521 and the second branch 522. It may be understood that an end part that is of the second conductive part 52 and that is opposite to the first conductive part 51 is the fifth end part 5211. A cross-sectional shape of the fifth end part 5211 is a rectangle, and a cross-sectional area of the fifth end part 5211 is equal to an area of the fifth through-hole 15. A specific tolerance range is allowed for the equality.

The third conductive part 53 includes a third branch 531 and a fourth branch 532. The third branch 531 includes a sixth end part 5311. An end part that is of the third branch 531 and that is opposite to the sixth end part 5311 is connected to an end part of the fourth branch 532. The third branch 531 is disposed vertical to the fourth branch 532 Both the third branch 531 and the fourth branch 532 are located on one side that is of the first conductive part 51 and that is opposite to the second branch 522, an end part that is of the fourth branch 532 and that is opposite to the third branch 531 is connected to the other end part of the first conductive part 51, and the first conductive part 51, the third branch 531, and the fourth branch 532 are vertically disposed. It may be understood that an end part that is of the third conductive part 53 and that is opposite to the first conductive part 51 is the sixth end part 5311.

The first conductive part 51 passes through the magnetic structure 20, and is spaced from the first connection part 31 and the first fastening part 41. The second conductive part 52 is located on one side that is of the magnetic structure 20 and that faces the third connection part 33 and the third fastening part 43, is spaced from the third connection part 33 and the third fastening part 43, and penetrates into the fastener 10. The third conductive part 53 is located on one side that is of the magnetic structure 20 and that faces the second connection part 32 and the second fastening part 42, is spaced from the second connection part 32 and the second fastening part 42, and penetrates into the fastener 10. For example, the first conductive part 51 passes through the traversing channel 23, and a length direction of the first conductive part 51 is parallel to a Y-axis direction. In other words, the first conductive part 51 extends in an extension direction of the traversing channel 23. In a Z-axis direction, the first conductive part 51 is located in the first connection part 31 and the first fastening part 41, and is spaced from the first connection part 31 and the first fastening part 41. That is, the first connection part 31, the first fastening part 41, and the first conductive part 51 all pass through the traversing channel 23 and are spaced from each other, and the first conductive part 51 is located between the first connection part 31 and the first fastening part 41. In addition, in a Z-axis direction (that is, a height direction of the magnetic structure 20), a projection of the first conductive part 51, a projection of the first connection part 31, and a projection of the first fastening part 41 overlap.

It may be understood that, in the height direction of the magnetic structure 20 (that is, in a direction vertical to the extension direction of the traversing channel 23), a projection of the negative primary side winding 50, a projection of the first positive primary side winding 30, and the second positive primary side winding 40 all overlap. This improves space utilization of the first positive primary side winding 30, the second positive primary side winding 40, and the negative primary side winding 50 in the traversing channel 23, and reduces a board area occupied by the current transformer 500, thereby facilitating the miniaturization design of the current transformer 500.

Both the first branch 521 and the second branch 522 are located on one side that is of the magnetic structure 20 and that faces the third connection part 33 and the third fastening part 43. A length direction of the second branch 522 is parallel to an X-axis direction; and in a Z-axis direction, the second branch 522 is located between the fourth part 332 (as shown in FIG. 7) and the fourth subpart 432 (as shown in FIG. 9), and is spaced from the fourth part 332 and the fourth subpart 432. A length direction of the first branch 521 is parallel to the Z-axis direction; and in the X-axis direction, the first branch 521 is located on one side that is of the third subpart 431 and that is opposite to the third part 331, and is spaced from the third subpart 431. The first branch 521 penetrates into the fifth through-hole 15 of the fastener 10 through glue bonding, welding, interference fitting, or the like. The fifth end part 5211 is located on one side that is of the fastener 10 and that is opposite to the magnetic structure 20. In addition, in the X-axis direction (that is, a first direction), the fifth end part 5211 is located on one side that is of the fourth end part 4311 and that is opposite to the second end part 3311, and is spaced from the fourth end part 4311. It may be understood that the second conductive part 52 extends in the height direction of the magnetic structure 20. In the extension direction of the traversing channel 23, the fifth end part 5211 is located at one end that is of the first conductive part 51 and that faces the second end part 3311 and the fourth end part 4311.

Both the third branch 531 and the fourth branch 532 are located on one side that is of the magnetic structure 20 and that faces the second connection part 32 and the second fastening part 42. A length direction of the fourth branch 532 is parallel to an X-axis direction; and in a Z-axis direction, the fourth branch 532 is located between the second part 322 and the second subpart 422, and is spaced from the second part 322 and the second subpart 422. A length direction of the third branch 531 is parallel to the Z-axis direction; and in the X-axis direction, the third branch 531 is located on one side that is of the first subpart 421 and that is opposite to the first part 321, and is spaced from the first subpart 421. The third branch 531 penetrates into the sixth through-hole 16 of the fastener 10 through glue bonding, welding, interference fitting, or the like. The sixth end part 5311 is located on one side that is of the fastener 10 and that is opposite to the magnetic structure 20. In addition, in the X-axis direction (that is, the first direction), the sixth end part 5311 is located on one side that is of the third end part 4211 and that is opposite to the first end part 3211, and is spaced from the third end part 4211. It may be understood that the third conductive part 53 extends in the height direction of the magnetic structure 20. In the extension direction of the traversing channel 23, the sixth end part 5311 is located at the other end that is of the first conductive part 51 and that faces the first end part 3211 and the third end part 4211.

In a Y-axis direction (that is, in the extension direction of the traversing channel 23), a spacing between the third end part 4211 and the fourth end part 4311, a spacing between the first end part 3211 and the second end part 3311, and a spacing between the fifth end part 5211 and the sixth end part 5311 are equal. This reduces a size of the current transformer 500 in the extension direction of the traversing channel 23, and reduces a board area occupied by the current transformer 500, thereby facilitating the miniaturization design of the current transformer 500.

It may be understood that the negative primary side winding 50 passes through the traversing channel 23, is spaced from the first positive primary side winding 30 and the second positive primary side winding 40, and penetrates into the fastener 10. The fifth end part 5211 is located on one side that is of the magnetic structure 20 and that faces the fourth end part 4311, and the sixth end part 5311 is located on one side that is of the magnetic structure 20 and that faces the third end part 4211. In other words, the first end part 3211, the third end part 4211, and the sixth end part 5311 are located on one side of the magnetic structure 20, and the fifth end part 5211, the fourth end part 4311, and the second end part 3311 are located on the other side of the magnetic structure 20.

In other words, the first positive primary side winding 30, the second positive primary side winding 40, and the negative primary side winding 50 penetrate into the fastener 10, and the first end part 3211, the second end part 3311, the third end part 4211, the fourth end part 4311, the fifth end part 5211, and the sixth end part 5311 are all located on one side that is of the fastener 10 and that is opposite to the magnetic structure 20. In this way, the magnetic structure 20, the first positive primary side winding 30, the second positive primary side winding 40, and the negative primary side winding 50 are assembled together by using the fastener 10, and the structure is simple and stable, which improves overall structure stability of the current transformer 500. In addition, a design in which the first end part 3211, the second end part 3311, the third end part 4211, the fourth end part 4311, the fifth end part 5211, and the sixth end part 5311 are located on one side that is of the fastener 10 and that is opposite to the magnetic structure 20 facilitates installation of the current transformer 500 and the circuit board 700, thereby reducing assembly difficulty.

Refer to FIG. 2, FIG. 3, and FIG. 8. The negative primary side winding 50 is connected to the circuit board 700. In some embodiments, a fifth end part 5211 of the negative primary side winding 50 is connected to a third wire 7013, and a sixth end part 5311 is connected to a sixth wire 7023. The fifth end part 5211 and the sixth end part 5311 are respectively connected to the third wire 7013 and the sixth wire 7023 in a manner including, but not limited to, welding. For example, a fifth plug hole (not shown in the figure) and a sixth plug hole are disposed at end parts of the third wire 7013 and the sixth wire 7023 of the circuit board 700; a metal layer is plated on a hole wall of each plug hole; and the fifth end part 5211 and the sixth end part 5311 are respectively inserted and welded into the fifth plug hole and the sixth plug hole. Therefore, the fifth end part 5211 is electrically connected and fastened to the third wire 7013, and the sixth end part 5311 is electrically connected and fastened to the sixth wire 7023. In other words, the circuit board 700 is fastened to and electrically connected to the fifth end part 5211 and the sixth end part 5311.

It may be understood that the fifth end part 5211 is electrically connected to a first negative electrode output end 902 of a first photovoltaic module 900 and a second negative electrode output end 904 of a second photovoltaic module 900a, and the sixth end part 5311 is electrically connected to the first boosting unit 401 and the second boosting unit 402. In other words, the sixth end part 5311 is electrically connected to a boosting module 400 and an inverter module 300, that is, electrically connected to the power conversion circuit 100b (as shown in FIG. 1). A third differential mode current I3 (that is, a combined current of a first differential mode current I1 and a second differential mode current I2) is transmitted from the sixth end part 5311 to the negative primary side winding 50 through the sixth wire 7023; and then, after passing through the traversing channel 23 of the magnetic structure 20 along the first conductive part 51 of the negative primary side winding 50, the third differential mode current I3 is transmitted from the fifth end part 5211 to the third wire 7013.

The third common mode current I3a (a combined current of a first common mode current I1a and a second common mode current I2a) is transmitted from the fifth end part 5211 to the negative primary side winding 50 through the third wire 7013; and then, after passing through the traversing channel 23 of the magnetic structure 20 along the first conductive part 51 of the negative primary side winding 50, the third common mode current I3a is transmitted from the sixth end part 5311 to the sixth wire 7023. It may be understood that the negative primary side winding 50 is configured to transmit the third differential mode current I3 and the third common mode current I3a, and the third differential mode current I3 flows from the sixth end part 5311 to the fifth end part 5211. The third common mode current I3a flows from the fifth end part 5211 to the sixth end part 5311. The third differential mode current I3 and the third common mode current I3a are transmitted in opposite directions in the first conductive part 51.

As shown in FIG. 3, both the first end part 3211 and the second end part 3311 are located on one side that is of the fifth end part 5211 and that is close to the sixth end part 5311, and both the third end part 4211 and the fourth end part 4311 are located on one side that is of the sixth end part 5311 and that is close to the fifth end part 5211. For example, in the first direction (that is, the X-axis direction), both the third end part 4211 and the fourth end part 4311 are located between the fifth end part 5211 and the sixth end part 5311, the first end part 3211 is located on one side that is of the third end part 4211 and that faces the sixth end part 5311, and the second end part 3311 is located on one side that is of the fourth end part 4311 and that faces the fifth end part 5211. In this way, according to the circuit board 700 designed based on such wiring of the current transformer 500, crossing of a plurality of wires that are disposed on the circuit board 700 and connected to the foregoing end parts can be avoided, and wiring on the board is simplified. This facilitates wiring on the circuit board 700, simplifies wiring, and reduces wiring design costs. In addition, this improves space utilization of the current transformer 500 in addition to avoiding wire crossing, thereby reducing a board area occupied by the current transformer 500, and facilitating miniaturization design of the current transformer 500.

Figure 11:
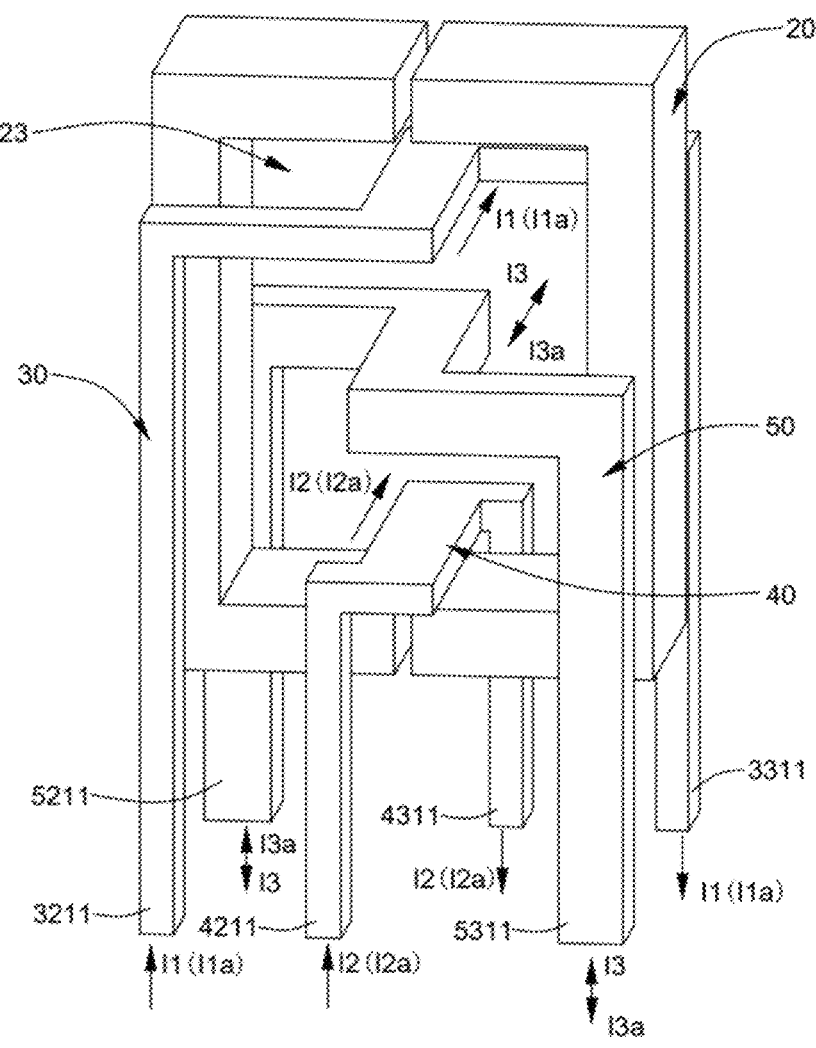
FIG. 11 is a schematic diagram of a three-dimensional structure of the current transformer shown in FIG. 3 (the fastener, the first secondary side winding, and the second secondary side winding are omitted)
Figure 12:
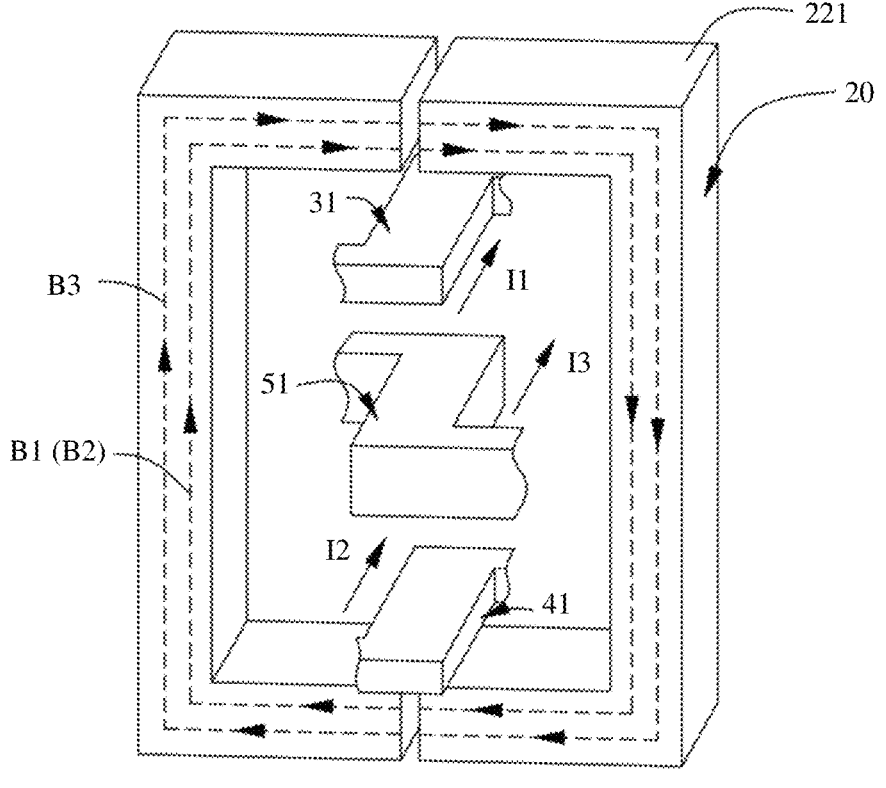
FIG. 12 is a schematic diagram of a direction in which a first differential mode current, a second differential mode current, and a third differential mode current pass through a magnetic structure of the current transformer shown in FIG. 11 to generate magnetic fluxes.

Refer to FIG. 11 and FIG. 12. FIG. 11 is a schematic diagram of a three-dimensional structure of the current transformer 500 shown in FIG. 3 (a fastener 10, a first secondary side winding 60, and a second secondary side winding 70 are omitted). FIG. 12 is a schematic diagram of a direction in which a first differential mode current I1, a second differential mode current I2, and a third differential mode current I3 pass through a magnetic structure 20 of the current transformer 500 shown in FIG. 11 to generate magnetic fluxes. The magnetic flux is a scalar. In the embodiments, a positive direction and a negative direction of the magnetic flux are related to a direction of a magnetic field that passes through a cross section of the magnetic structure 20, and the direction of the magnetic field is a positive direction of the magnetic flux.

The first differential mode current I1 passes through a traversing channel 23 of the magnetic structure 20 along a first connection part 31 of a first positive primary side winding 30, the first differential mode current I1 generates a first magnetic field B1, and a magnetic field direction of the first magnetic field B1 is a clockwise direction. When the first magnetic field B1 passes through a cross section of a fourth magnet 221, a magnetic field direction of the first magnetic field B1 in a fourth magnet 221 is rightward, and a positive direction of a magnetic flux (that is, a first magnetic flux φ1) generated by the first differential mode current I1 in the fourth magnet 221 of the magnetic structure 20 is rightward.

The second differential mode current I2 passes through the traversing channel 23 of the magnetic structure 20 along the first fastening part 41 of the second positive primary side winding 40, the second differential mode current I2 generates a second magnetic field B2, and a direction of the second magnetic field B2 is a clockwise direction. When the second magnetic field B2 passes through the cross section of the fourth magnet 221, a magnetic field direction of the second magnetic field B2 in the fourth magnet 221 is rightward, and a positive direction of a magnetic flux (that is, a second magnetic flux φ2) generated by the second differential mode current I2 in the fourth magnet 221 of the magnetic structure 20 is rightward. It may be understood that, because a value of the first differential mode current I1 is equal to a value of the second differential mode current I2, the second magnetic flux φ2 is equal to the first magnetic flux φ1.

The third differential mode current I3 passes through the traversing channel 23 of the magnetic structure 20 along the first conductive part 51 of the negative primary side winding 50, and the third differential mode current I3 generates a third magnetic field B3. A direction of the third magnetic field B3 is a clockwise direction. When the third magnetic field B3 passes through the cross section of the fourth magnet 221, a magnetic field direction of the third magnetic field B3 in the fourth magnet 221 is rightward, and a positive direction of a magnetic flux (that is, a third magnetic flux φ3) generated by the third differential mode current I3 in the fourth magnet 221 of the magnetic structure 20 is rightward. It may be understood that, because a value of the third differential mode current I3 is equal to a sum of the value of the first differential mode current I1 and the value of the second differential mode current I2, the third magnetic flux φ3 is equal to a sum of the first magnetic flux φ1 and the second magnetic flux φ2.

Because the positive directions of the first magnetic flux φ1, the second magnetic flux φ2, and the third magnetic flux φ3 are the same, the first magnetic flux φ1, the second magnetic flux φ2, and the third magnetic flux φ3 are superposed. In other words, magnetic fluxes generated by the first differential mode current I1, the second differential mode current I2, and the third differential mode current I3 in the fourth magnet 221 of the magnetic structure 20 are 6φ1, 6φ2, and 2φ3. It may be understood that magnetic fluxes generated by the first differential mode current I1, the second differential mode current I2, and the third differential mode current I3 in a same position of the magnetic structure 20 are superposed.

Figure 13:
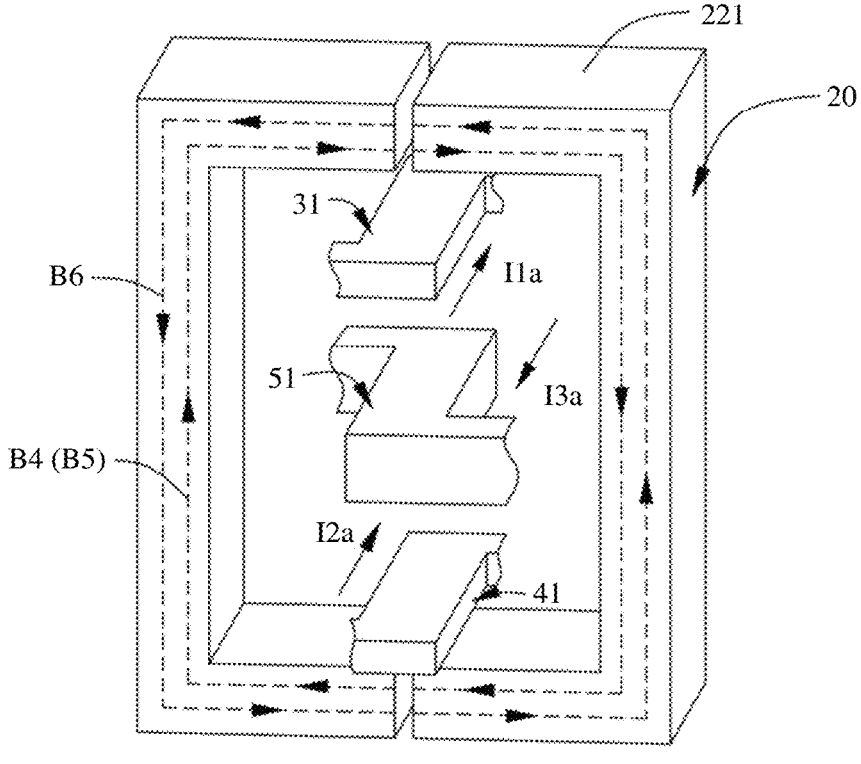
FIG. 13 is a schematic diagram of a direction of a magnetic flux generated when a first common mode current, a second common mode current, and a third common mode current pass through a magnetic structure of the current transformer shown in FIG. 11.

Refer to FIG. 11 and FIG. 13. FIG. 13 is a schematic diagram of a direction of a magnetic flux generated when a first common mode current I1a, a second common mode current I2a, and a third common mode current I3a pass through a magnetic structure 20 of the current transformer 500 shown in FIG. 11.

The first common mode current I1a passes through a traversing channel 23 of the magnetic structure 20 along a first connection part 31 of a first positive primary side winding 30, the first common mode current I1a generates a first common mode magnetic field B4, and a magnetic field direction of the first common mode magnetic field B4 is a clockwise direction. When the first common mode magnetic field B4 passes through a cross section of a fourth magnet 221, a magnetic field direction of the first common mode magnetic field B4 in a fourth magnet 221 is rightward, and a positive direction of a magnetic flux (that is, a first common mode magnetic flux φ4) generated by the first common mode current I1a in the fourth magnet 221 of the magnetic structure 20 is rightward.

The second common mode current I2a passes through the traversing channel 23 of the magnetic structure 20 along the first fastening part 41 of the second positive primary side winding 40, the second common mode current I2a generates a second common mode magnetic field B5, and a direction of the second common mode magnetic field B5 is a clockwise direction. When the second common mode magnetic field B5 passes through the cross section of the fourth magnet 221, a magnetic field direction of the second common mode magnetic field B5 in the fourth magnet 221 is rightward, and a positive direction of a magnetic flux (that is, a second common mode magnetic flux φ5) generated by the second common mode current I2a in the fourth magnet 221 of the magnetic structure 20 is rightward. It may be understood that, because the value of the first common mode current I1a is equal to the value of the second common mode current I2a, the second common mode flux φ5 is equal to the first common mode flux φ4.

The third common mode current I3a passes through the traversing channel 23 of the magnetic structure 20 along the first conductive part 51 of the negative primary side winding 50, and the third common mode current I3a generates a third common mode magnetic field B6. A direction of the third common mode magnetic field B6 is a counterclockwise direction. When the third common mode magnetic field B6 passes through the cross section of the fourth magnet 221, a magnetic field direction of the third common mode magnetic field B6 in the fourth magnet 221 is leftward, and a positive direction of a magnetic flux (that is, a third common mode magnetic flux φ6) generated by the third common mode current I3a in the second magnet 212 of the magnetic structure 20 is leftward. It may be understood that, because the third common mode current I3a is a combined current of the first common mode current I1a and the second common mode current I2a, a value of the third common mode current I3a is equal to a sum of the value of the first common mode current I1a and the value of the second common mode current I2a, and the third common mode magnetic flux φ6 is equal to a sum of the first common mode magnetic flux φ4 and the second common mode magnetic flux φ5. Therefore, the third common mode flux φ6 offsets the first common mode flux φ4 and the second common mode flux φ5. It may be understood that magnetic fluxes generated by the first common mode current I1a, the second common mode current I2a, and the third common mode current I3a in a same position of the magnetic structure 20 all offset each other.

Refer to FIG. 2, FIG. 3, FIG. 12, and FIG. 13. When a current transformer 500 is applied to a photovoltaic generation system 1000, after a plurality of currents output by photovoltaic modules (including a first photovoltaic module 900 and a second photovoltaic module 900a) flow through the current transformer 500 of a photovoltaic converter 800a, magnetic fluxes generated by a first differential mode current I1, a second differential mode current I2, and a third differential mode current I3 in a magnetic structure 20 are superimposed, and magnetic fluxes generated by the first common mode current I1a, the second common mode current I2a, and the third common mode current I3a offset each other. Therefore, the magnetic fluxes generated by the magnetic structure 20 can be magnetic fluxes generated by differential mode currents. Subsequently, a first induced current I4 and a second induced current I5 that are respectively generated by a first secondary side winding 60 and a second secondary side winding 70 are induced currents corresponding to differential mode currents, thereby achieving an effect of suppressing common mode currents. Because the arcing signal is a differential mode current signal, noise impact caused by a common mode current is reduced, and independent measurement of the differential mode current is implemented. This facilitates detection of the arcing signal by the detection module 100a, and improves accuracy and a speed of arcing detection. Because a first connection part 31, a first fastening part 41, and a first conductive part 51 all extend in an extension direction of a traversing channel 23, each differential mode current and each common mode current can vertically pass through the magnetic structure 20. In this way, the magnetic fluxes generated by the common mode current and the differential mode current in the magnetic structure 20 are higher, so that the first secondary side winding 60 and the second secondary side winding 70 respectively output a first induced current I4 and a second induced current I5 subsequently.

In addition, because the first connection part 31 of the first positive primary side winding 30, the first fastening part 41 of the second positive primary side winding 40, and the first conductive part 51 of the negative primary side winding 50 all pass through the traversing channel 23 of the magnetic structure 20, magnetic fluxes generated by common mode currents (that is, the first common mode current I1a, the second common mode current I2a, and the third common mode current I3a) transmitted in the three primary side windings have the same magnetic path. This facilitates suppressing of noise caused by the common mode current, thereby improving a capability of the current transformer 500 to suppress common mode noise, and further facilitating subsequent detection of an arcing signal. In addition, because the first conductive part 51 is located between the first connection part 31 and the first fastening part 41, this facilitates offsetting of a sum of magnetic fluxes (a sum of magnetic fluxes generated by the first common mode current I1a and the second common mode current I2a) generated by common mode currents transmitted by the first connection part 31 and the first fastening part 41 with a magnetic flux (a magnetic flux generated by the third common mode current I3a) generated by common mode currents transmitted by the first conductive part 51, thereby further improving a capability of the current transformer 500 to suppress common mode noise, and further facilitating subsequent detection of an arcing signal.

According to the current transformer 500 provided in the embodiments, arcing signals in a plurality of currents output by photovoltaic modules (including the first photovoltaic module 900 and the second photovoltaic module 900a) can be collected once, so that arcing signals in the plurality of currents can be detected once, thereby avoiding collecting the arcing signals of each current, and avoiding a plurality of times of detection of the arcing signals in the plurality of currents. The design of the current transformer 500 not only improves efficiency of collecting the arcing signals, but also reduces detection costs because of a simple structure.

Refer to FIG. 3, FIG. 6, and FIG. 8. A first secondary side winding 60 is wound around a magnetic structure 20, and penetrates into a fastener 10. In some embodiments, the first secondary side winding 60 is wound around a fourth magnet 221 of the magnetic structure 20. In some other embodiments, the first secondary side winding 60 may alternatively be wound around a first magnet 211, a second magnet 212, a third magnet 213, a fifth magnet 222, a sixth magnet 223, or the like. A position of the first secondary side winding 60 is not limited.

The first secondary side winding 60 is a coil formed by winding a first conductive wire. For example, the first conductive wire is a copper wire. In some other embodiments, the first conductive wire may alternatively be made of another conductive metal material such as silver or aluminum or another material. The first secondary side winding 60 includes a first output end 61 and a second output end 62. The first output end 61 penetrates into a seventh through-hole 17 of a fastener 10 through welding, glue bonding, interference fitting, or the like. The second output end 62 penetrates into an eighth through-hole 18 of the fastener 10 through welding, glue bonding, interference fitting, or the like. Both the first output end 61 and the second output end 62 are located on at least one side that is of the fastener 10 and that is opposite to the magnetic structure 20. Both the first output end 61 and the second output end 62 are located on one side that is of the magnetic structure 20 and that faces a fifth end part 5211, a fourth end part 4311, and a second end part 3311. The first output end 61 is located between the fourth end part 4311 and the fifth end part 5211, and is spaced from the fourth end part 4311 and the fifth end part 5211. The second output end 62 is located between the first output end 61 and the fourth end part 4311, and is spaced from the first output end 61 and the fourth end part 4311. The first secondary side winding 60 is connected to a circuit board 700. In some embodiments, the first output end 61 and the second output end 62 of the first secondary side winding 60 are respectively connected to two detection wires 7071. The first output end 61 and the second output end 62 are respectively connected to the two detection wires 7071 in a manner including, but not limited to, welding. For example, a seventh plug hole (not shown in the figure) and an eighth plug hole are respectively disposed on end parts of the two detection wires 7071 of the circuit board 700; a metal layer is plated on a hole wall of each plug hole; and the first output end 61 and the second output end 62 are respectively inserted and welded into the seventh plug hole and the eighth plug hole. Therefore, the first output end 61 and the second output end 62 are respectively electrically connected and fastened to the two detection wires 7071.

It may be understood that the first output end 61 and the second output end 62 are electrically connected to the detection module 100a. According to the principle of electromagnetic induction, the first secondary side winding 60 may output a first induced current I4 according to a sum of magnetic fluxes generated by primary side windings in the magnetic structure 20. After being output through the first output end 61 and the second output end 62, the first induced current I4 is transmitted to the detection module 100a along the two detection wires 7071, so that the detection module 100a detects an arcing current signal in the first induced current I4.

It should be noted that a sum of magnetic fluxes generated by the primary side winding in the magnetic structure 20 is a sum of magnetic fluxes generated by a first differential mode current I1, a second differential mode current I2, a third differential mode current I3, a first common mode current I1a, a second common mode current I2a, and a third common mode current I3a. In this embodiment, the sum of the magnetic fluxes generated by the primary side winding in the magnetic structure 20 is a sum of a first magnetic flux φ1, a second magnetic flux φ2, a third magnetic flux φ3, a first common mode magnetic flux φ4, a second common mode magnetic flux φ5, and a third common mode magnetic flux φ6. Because the third common mode flux φ6 offsets the sum of the magnetic fluxes of the first common mode flux φ4 and the second common mode flux φ5, the first secondary side winding 60 outputs the first induced current I4 according to the magnetic flux generated by the differential mode current. In addition, because an arcing signal is a differential mode signal, this facilitates subsequent detection of an arcing current signal in the first induced current I4 by the detection module 100a, thereby improving accuracy and a speed of subsequent arcing detection.

It may be understood that both the first output end 61 and the second output end 62 penetrate into the fastener 10, and are at least partially located on one side that is of the fastener 10 and that is opposite to the magnetic structure 20, which facilitates connection between the first secondary side winding 60 and the circuit board 700.

The second secondary side winding 70 is wound around the magnetic structure 20, and penetrates into the fastener 10. In some embodiments, the second secondary side winding 70 is wound around the fourth magnet 221 of the magnetic structure 20, and is spaced from the first secondary side winding 60. In some other embodiments, the second secondary side winding 70 may alternatively be wound around a first magnet 211, a second magnet 212, a third magnet 213, a fifth magnet 222, a sixth magnet 223, or the like. A position of the second secondary side winding 70 is not limited.

The second secondary side winding 70 is a coil formed by winding a second conductive wire. For example, the second conductive wire is a copper wire. In some other embodiments, the second conductive wire may alternatively be made of another conductive metal material such as silver or aluminum or another material. The second secondary side winding 70 includes a third output end 71 and a fourth output end 72. The third output end 71 penetrates into a ninth through-hole 19 of the fastener 10 through welding, glue bonding, interference fitting, or the like. The fourth output end 72 penetrates into a tenth through-hole 19a of the fastener 10 through welding, glue bonding, interference fitting, or the like. Both the third output end 71 and the fourth output end 72 are located on at least one side that is of the fastener 10 and that is opposite to the magnetic structure 20. Both the third output end 71 and the fourth output end 72 are located on one side that is of the magnetic structure 20 and that faces the fifth end part 5211, the fourth end part 4311, and the second end part 3311. The third output end 71 is located between the fifth end part 5211 and the first output end 61, and is spaced from the fifth end part 5211 and the first output end 61. The fourth output end 72 is located between the third output end 71 and the first output end 61, and is spaced from the third output end 71 and the first output end 61.

The second secondary side winding 70 is connected to the circuit board 700. In some embodiments, the third output end 71 and the fourth output end 72 of the second secondary side winding 70 are respectively connected to two self-test wires 7072. The third output end 71 and the fourth output end 72 are respectively connected to the two self-test wires 7072 in a manner including, but not limited to, welding. For example, a ninth plug hole (not shown in the figure) and a tenth plug hole are respectively disposed on end parts of the two self-test wires 7072 of the circuit board 700; a metal layer is plated on a hole wall of each plug hole; and the third output end 71 and the fourth output end 72 are respectively inserted and welded into the ninth plug hole and the tenth plug hole. Therefore, the third output end 71 and the fourth output end 72 are respectively electrically connected and fastened to the two self-test wires 7072.

It may be understood that the third output end 71 and the fourth output end 72 are electrically connected to the detection module 100a. According to the principle of electromagnetic induction, the second secondary side winding 70 may output a second induced current I5 according to a sum of magnetic fluxes generated by primary side windings in the magnetic structure 20. After being output through the third output end 71 and the fourth output end 72, the second induced current I5 is transmitted to the detection module 100a along the two self-test wires 7072. The detection module 100a outputs a simulated arcing signal according to the second induced current I5, so as to perform self-test of the detection module 100a. It should be noted that, as described above, the magnetic flux generated by the primary side winding in the magnetic structure 20 can be a magnetic flux generated by a differential mode current.

In this embodiment, a quantity of turns of the first secondary side winding 60 is different from a quantity of turns of the second secondary side winding 70, and a value of the first induced current I4 output by the first secondary side winding 60 is different from a value of the second induced current I5 output by the second secondary side winding 70. In some other embodiments, the quantity of turns of the first secondary side winding 60 may be the same as the quantity of turns of the second secondary side winding 70, so that the value of the first induced current I4 output by the first secondary side winding 60 is equal to the value of the second induced current I5 output by the second secondary side winding 70. This is not limited.

It may be understood that, according to the principle of electromagnetic induction, the first secondary side winding 60 and the second secondary side winding 70 each may output a current according to a sum of magnetic fluxes generated by a current transmitted in each primary side winding. If the quantity of turns of the second secondary side winding 70 is different from the quantity of turns of the first secondary side winding 60, a magnitude of the current output by the second secondary side winding 70 is different from a magnitude of the current output by the first secondary side winding 60. If the quantity of turns of the second secondary side winding 70 is the same as the quantity of turns of the first secondary side winding 60, the magnitude of the current output by the second secondary side winding 70 is the same as the magnitude of the current output by the first secondary side winding 60. The current transformer 500 may be provided with a plurality of secondary side windings with different quantities of turns or the same quantity of turns, so as to output a plurality of same or different currents that meet a requirement.

It may be understood that both the third output end 71 and the fourth output end 72 penetrate into the fastener 10, and are at least partially located on one side that is of the fastener 10 and that is opposite to the magnetic structure 20, which facilitates connection between the second secondary side winding 70 and the circuit board 700.

Refer to FIG. 1, FIG. 2, FIG. 3, FIG. 8, FIG. 12, and FIG. 13. In the embodiments, direct currents output by a first photovoltaic module 900 and a second photovoltaic module 900*a* are transmitted to a power conversion circuit 100*b* through the current transformer 500, and the power conversion circuit 100*b* outputs alternating currents based on the direct currents. The current transformer 500 may be used to perform arcing detection on a direct current side of a photovoltaic converter 800*a*. When an arcing fault occurs on the direct current side of the photovoltaic converter 800*a* (for example, an arcing fault occurs on the first photovoltaic module 900 or the second photovoltaic module 900*a* due to aging), there is an arcing signal (a differential mode signal) in the direct current received by the direct current side of the photovoltaic converter 800*a*, and the current transformer 500 collects the arcing signal from the direct current, to facilitate subsequent detection of an arcing signal.

In the embodiments, the current transformer 500 transmits, through the first positive primary side winding 30, the second positive primary side winding 40, and the negative primary side winding 50, a plurality of currents received from the direct current side of the photovoltaic converter 800*a*. According to the principle of electromagnetic induction, the first secondary side winding 60 outputs a first induced current I4 by coupling based on a current transmitted in each primary side winding, and an arcing signal may be transmitted to a subsequent component along with the first induced current I4 output by the first secondary side winding 60, so as to detect the arcing signal. Therefore, the current transformer 500 provided in the embodiments can collect arcing signals of the plurality of currents received from the direct current side of the photovoltaic converter 800*a* once, so that arcing signals of the plurality of currents can be detected once, thereby avoiding collecting arcing signals of each current, and avoiding repeated detection of arcing signals of the plurality of currents. The design of the current transformer 500 not only improves efficiency of collecting the arcing signals, but also reduces detection costs because of a simple structure. In addition, a quantity of current transformers 500 is reduced, thereby reducing an occupied board area and facilitating a miniaturization design of the photovoltaic converter 800*a*.

When an arcing fault occurs on the direct current side of the photovoltaic converter 800*a*, a direct current received by the direct current side of the photovoltaic converter 800*a* further has a common mode noise signal. In other words, the first photovoltaic module 900 outputs a first differential mode current I1 and a first common mode current I1*a*, and the second photovoltaic module 900*a* outputs a second differential mode current I2 and a second common mode current I2*a*. The first positive primary side winding 30 transmits the first differential mode current I1 and the first common mode current I1*a*, and both the first differential mode current I1 and the first common mode current I1*a* flow from the first end part 3211 to the second end part 3311. The second positive primary side winding 40 transmits the second differential mode current I2 and the second common mode current I2*a*, and both the second differential mode current I2 and the second common mode current I2*a* flow from the third end part 4211 to the fourth end part 4311. The negative primary side winding 50 transmits a third differential mode current I3 (a combined current of the first differential mode current I1 and the second differential mode current I2) and a third common mode current I3*a* (a combined current of the first common mode current I1*a* and the second common mode current I2*a*), the third differential mode current I3 flows from the sixth end part 5311 to the fifth end part 5211, and the third common mode current I3*a* flows from the fifth end part 5211 to the sixth end part 5311.

Because the first end part 3211, the third end part 4211, and the sixth end part 5311 are located on one side of the magnetic structure 20, and the fifth end part 5211, the fourth end part 4311, and the second end part 3311 are located on the other side of the magnetic structure 20, such a design enables the first differential mode current I1, the second differential mode current I2, and the third differential mode current I3 to pass through the magnetic structure 20 in a same direction, and magnetic fluxes generated by the first differential mode current I1, the second differential mode current I2, and the third differential mode current I3 in the magnetic structure 20 are superimposed. In this way, the first common mode current I1*a* and the second common mode current I2*a* pass through the magnetic structure 20 in a same direction, the third common mode current I3*a* passes through the magnetic structure 20 in a direction opposite to the direction in which the first common mode current I1*a* and the second common mode current I2*a* pass through the magnetic structure 20, and a sum of magnetic fluxes generated by the first common mode current I1*a* and the second common mode current I2*a* in the magnetic structure 20 offsets a magnetic flux generated by the third common mode current I3*a* in the magnetic structure 20. Therefore, the magnetic flux generated by the magnetic structure 20 can be a magnetic flux generated by a differential mode current. According to the principle of electromagnetic induction, the first induced current I4 and the second induced current I5 that are output by coupling the currents transmitted on the first secondary side winding 60 and the second secondary side winding 70 are induced currents corresponding to differential mode currents. In this way, an effect of suppressing common mode currents is achieved, noise impact caused by the common mode current is reduced, and independent measurement of the differential mode current is implemented. This facilitates subsequent detection of an arcing signal, and improves accuracy and a speed of subsequent arcing detection.

In addition, because the first positive primary side winding 30, the second positive primary side winding 40, and the negative primary side winding 50 all pass through the traversing channel 23 of the magnetic structure 20, magnetic fluxes generated by the first common mode current I1*a*, the second common mode current I2*a*, and the third common mode current I3*a* have a same magnetic path. This facilitates suppressing of noise impact caused by the common mode current, thereby further facilitating subsequent detection of an arcing signal.

When the current transformer 500 provided in the embodiments is applied to the photovoltaic converter 800*a*, wires that are disposed on the circuit board 700 and used to connect to the current transformer 500 may further be prevented from crossing, that is, the first wire 7011, the second wire 7012, the third wire 7013, the fourth wire 7021, the fifth wire 7022, the sixth wire 7023, the detection wire 7071, and the self-test wire 7072 are prevented from crossing. According to the current transformer 500 provided in the embodiments, wiring on a board is simplified, wiring on the circuit board 700 is facilitated, difficulty in wiring on the circuit board 700 is reduced, and wiring design costs are reduced.

Figure 14:
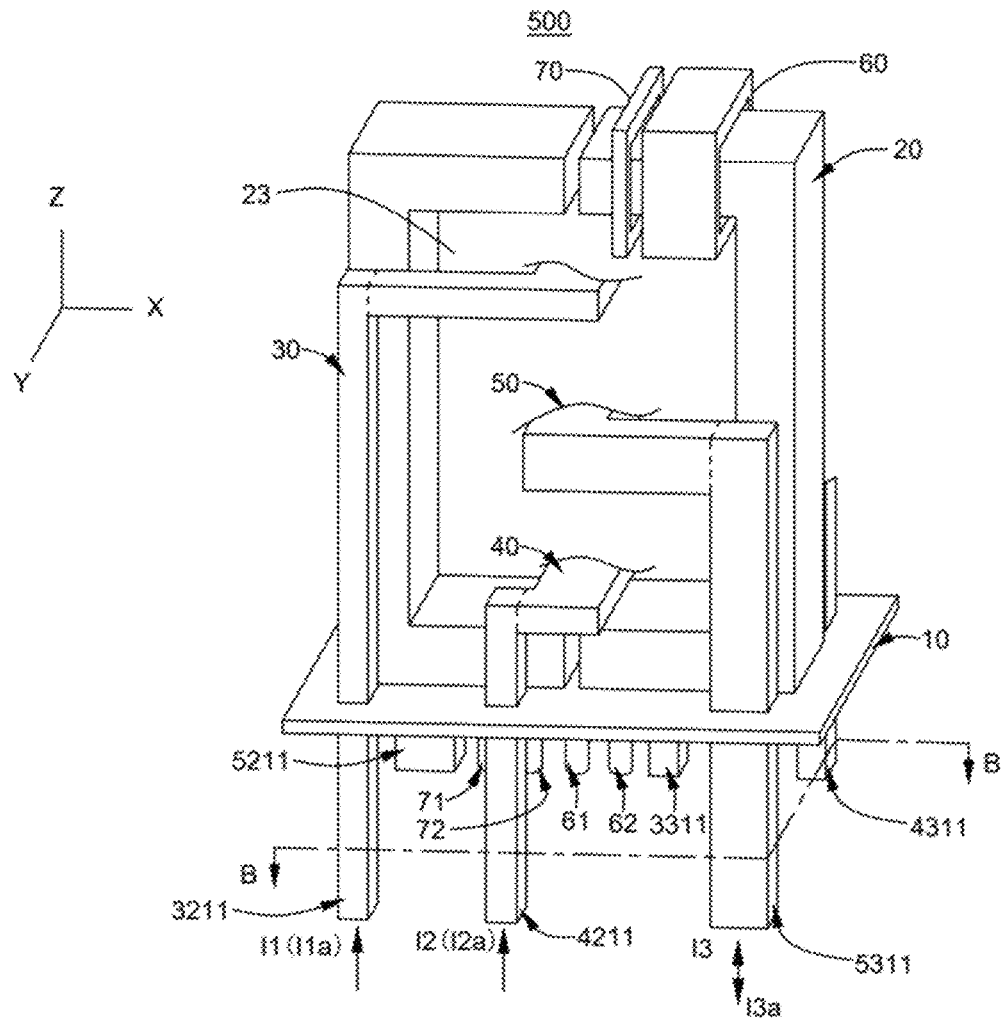
FIG. 14 is a schematic diagram of a three-dimensional structure of a current transformer according to another embodiment.
Figure 15:
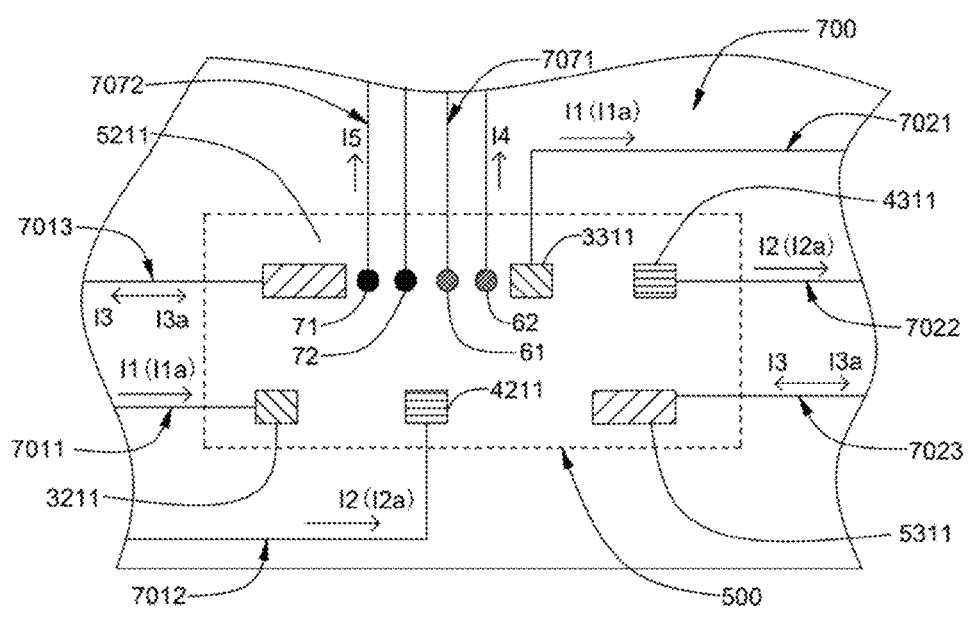
FIG. 15 is a schematic diagram of a partial structure that is obtained by cutting along a line B-B after the current transformer shown in FIG. 14 fits with a circuit board.

Refer to FIG. 2, FIG. 14, and FIG. 15. FIG. 14 is a schematic diagram of a three-dimensional structure of a current transformer 500 according to another embodiment.

FIG. 15 is a schematic diagram of a partial structure that is obtained by cutting along a line B-B after the current transformer 500 shown in FIG. 14 fits with a circuit board 700.

The current transformer 500 includes a fastener 10, a magnetic structure 20, a first positive primary side winding 30, a second positive primary side winding 40, a negative primary side winding 50, a first secondary side winding 60, and a second secondary side winding 70. The magnetic structure 20 is fastened to the fastener 10. The first positive primary side winding 30 passes through the magnetic structure 20 and is not in contact with the magnetic structure 20, and the first positive primary side winding 30 passes through the fastener 10 and is fastened to the fastener 10. The second positive primary side winding 40 passes through the magnetic structure 20 and is not in contact with the magnetic structure 20, and the second positive primary side winding 40 passes through the fastener 10 and is fastened to the fastener 10. The negative primary side winding 50 passes through the magnetic structure 20 and is not in contact with the magnetic structure 20, and the negative primary side winding 50 passes through the fastener 10 and is fastened to the fastener 10. The first secondary side winding 60 is wound around the magnetic structure 20. The first secondary side winding 60 passes through the fastener 10, and is fastened to the fastener 10. The second secondary side winding 70 is wound around the magnetic structure 20. The second secondary side winding 70 is fastened to the fastener 10 through the fastener 10.

The first positive primary side winding 30 is connected to a first wire 7011 and a fourth wire 7021; the first positive primary side winding 30 is electrically connected to a first positive electrode output end 901 and a second boosting unit 402; the first positive primary side winding 30 is configured to transmit a first differential mode current I1 and a first common mode current I1a; and the first differential mode current I1 and the first common mode current I1a are transmitted from the first positive electrode output end 901 to the second boosting unit 402 through a first wiring terminal 601 and the first positive primary side winding 30.

The second positive primary side winding 40 is connected to the second wire 7012 and the fifth wire 7022; the second positive primary side winding 40 is electrically connected to the second positive electrode output end 903 and the first boosting unit 401; the second positive primary side winding 40 is configured to transmit a second differential mode current I2 and a second common mode current I2a; and the second differential mode current I2 and the second common mode current I2a are transmitted from the second positive electrode output end 903 to the first boosting unit 401 through the second wiring terminal 602 and the second positive primary side winding 40.

The negative primary side winding 50 is connected to the third wire 7013 and the sixth wire 7023, the negative primary side winding 50 is electrically connected to the first negative electrode output end 902, the second negative electrode output end 904, the first boosting unit 401, and the second boosting unit 402, and the negative primary side winding 50 is configured to transmit a third differential mode current I3 and a third common mode current I3a, the third differential mode current I3 is transmitted from the first boosting unit 401 and the second boosting unit 402 to the third wiring terminal 603 through the negative primary side winding 50; and the third common mode current I3a is transmitted from the third wiring terminal 603 to the first boosting unit 401 and the second boosting unit 402 through the negative primary side winding 50.

The first secondary side winding 60 is connected to the two detection wires 7071, the first secondary side winding 60 is electrically connected to the detection module 100a, and the first secondary side winding 60 is configured to output a first induced current I4 by coupling based on currents transmitted in the first positive primary side winding 30, the second positive primary side winding 40, and the negative primary side winding 50, for example, output the first induced current I4 according to a sum of magnetic fluxes. The second secondary side winding 70 is connected to the two self-test wires 7072, the second secondary side winding 70 is electrically connected to the detection module 100a, and the second secondary side winding 70 is configured to output a second induced current I5 by coupling based on currents transmitted in the first positive primary side winding 30, the second positive primary side winding 40, and the negative primary side winding 50, for example, output the second induced current I5 according to a sum of magnetic fluxes. It should be noted that the sum of magnetic fluxes is a sum of magnetic fluxes generated by the first differential mode current I1, the second differential mode current I2, the third differential mode current I3, the first common mode current I1a, the second common mode current I2a, and the third common mode current I3a in the magnetic structure 20.

Different from the embodiment shown in FIG. 3, in this embodiment, the first positive primary side winding 30 is connected to the first wire 7011 and the fourth wire 7021, the first positive primary side winding 30 is electrically connected to the first positive electrode output end 901 and the second boosting unit 402, the second positive primary side winding 40 is connected to the second wire 7012 and the fifth wire 7022, and the second positive primary side winding 40 is electrically connected to the second positive electrode output end 903 and the first boosting unit 401.

For example, the first positive primary side winding 30 includes a first end part 3211 and a second end part 3311. The first end part 3211 and the second end part 3311 are located on two opposite sides of the magnetic structure 20, and are both located on one side that is of the fastener 10 and that is opposite to the magnetic structure 20. A first positive primary side winding 30 is connected to the circuit board 700. The first end part 3211 is connected to the first wire 7011, and the second end part 3311 is connected to the fourth wire 7021. For a specific connection manner, refer to the example in FIG. 3. Details are not described again. It may be understood that the first end part 3211 is electrically connected to the first positive electrode output end 901, and the second end part 3311 is electrically connected to the second boosting unit 402, that is, the second end part 3311 is electrically connected to the boosting module 400 and the inverter module 300. After being transmitted from the first end part 3211 to the first positive primary side winding 30 through the first wire 7011, the first differential mode current I1 and the first common mode current I1a are transmitted from the second end part 3311 to the fourth wire 7021 along the first positive primary side winding 30.

The second positive primary side winding 40 includes a third end part 4211 and a fourth end part 4311. The third end part 4211 is located on one side that is of the magnetic structure 20 and that faces the first end part 3211, and is spaced from the first end part 3211. The fourth end part 4311 is located on one side that is of the magnetic structure 20 and that faces the second end part 3311, and is spaced from the second end part 3311. In an X-axis direction, the third end part 4211 is located on one side that is of the first end part 3211 and that is close to the second end part 3311, and is spaced from the first end part 3211; and in the X-axis direction, the fourth end part 4311 is located on one side that is of the second end part 3311 and that is away from the first end part 3211, and is spaced from the second end part 3311.

The second positive primary side winding 40 is connected to the circuit board 700. For example, the third end part 4211 is connected to the second wire 7012, and the fourth end part 4311 is connected to the fifth wire 7022. For a specific connection manner, refer to the example in FIG. 3. Details are not described again. It may be understood that the third end part 4211 is electrically connected to the second positive electrode output end 903, and the fourth end part 4311 is electrically connected to the first boosting unit 401. After being transmitted from the third end part 4211 to the second positive primary side winding 40 through the second wire 7012, the second differential mode current I2 and the second common mode current I2a are transmitted from the fourth end part 4311 to the fifth wire 7022 along the second positive primary side winding 40.

It may be understood that, in this embodiment, the first differential mode current I1 is transmitted from the first positive electrode output end 901 to the negative primary side winding 50 sequentially along the first cable 801, the first wire 7011, the first positive primary side winding 30, the fifth wire 7022, the first boosting unit 401, the eighth wire 7025, and the sixth wire 7023. The second differential mode current I2 is transmitted from the second positive electrode output end 903 to the negative primary side winding 50 sequentially along the second cable 802, the second wire 7012, the second positive primary side winding 40, the fourth wire 7021, the second boosting unit 402, the seventh wire 7024, and the sixth wire 7023. A combined current (that is, the third differential mode current I3) of the first differential mode current I1 and the second differential mode current I2 still flows in the sixth wire 7023 and the third wire 7013. Flow directions of the first common mode current I1a, the second common mode current I2a, and the third common mode current I3a are the same as those in the example in FIG. 3, and details are not described again.

The negative primary side winding 50 includes a fifth end part 5211 and a sixth end part 5311. The fifth end part 5211 is located on one side that is of the magnetic structure 20 and that faces the second end part 3311 and the fourth end part 4311, and is spaced from the second end part 3311 and the fourth end part 4311. The sixth end part 5311 is located on one side that is of the magnetic structure 20 and that faces the first end part 3211 and the third end part 4211, and is spaced from the first end part 3211 and the third end part 4211. In the X-axis direction, the fifth end part 5211 is located on one side that is of the second end part 3311 and that is away from the fourth end part 4311, and is spaced from the second end part 3311; and the sixth end part 5311 is located on one side that is of the third end part 4211 and that is away from the first end part 3211, and is spaced from the third end part 4211.

The negative primary side winding 50 is connected to the circuit board 700. For example, the fifth end part 5211 is connected to the third wire 7013, and the sixth end part 5311 is connected to the sixth wire 7023. For a specific connection manner, refer to the example in FIG. 3. Details are not described again. It may be understood that the fifth end part 5211 is electrically connected to the first negative electrode output end 902 and the second negative electrode output end 904, and the sixth end part 5311 is electrically connected to the first boosting unit 401 and the second boosting unit 402, that is, the sixth end part 5311 is electrically connected to the boosting module 400 and the inverter module 300. After being transmitted from the sixth end part 5311 to the negative primary side winding 50 through the sixth wire 7023, the third differential mode current I3 is transmitted from the fifth end part 5211 to the third wire 7013 along the negative primary side winding 50.

As shown in FIG. 14, both the first end part 3211 and the second end part 3311 are located on one side that is of the fifth end part 5211 and that is close to the sixth end part 5311, and both the third end part 4211 and the fourth end part 4311 are located on one side that is of the sixth end part 5311 and that is close to the fifth end part 5211. For example, in an extension direction (that is, a Y-axis direction) of the traversing channel 23, the fifth end part 5211 and the sixth end part 5311 are disposed in a staggered manner. In a first direction (that is, an X-axis direction), both the third end part 4211 and the second end part 3311 are located between the fifth end part 5211 and the sixth end part 5311, the first end part 3211 is located on one side that is of the third end part 4211 and that is opposite to the sixth end part 5311, and the fourth end part 4311 is located on one side that is of the second end part 3311 and that is opposite to the fifth end part 5211.

In this way, according to the circuit board 700 designed based on such wiring of the current transformer 500, crossing of a plurality of wires that are disposed on the circuit board 700 and connected to the foregoing end parts can be avoided, and wiring on the board is simplified. This facilitates wiring on the circuit board 700, simplifies wiring, and reduces wiring design costs. In addition, this improves space utilization of the current transformer 500 in addition to avoiding wire crossing, thereby reducing a board area occupied by the current transformer 500, and facilitating miniaturization design of the current transformer 500.

Compared with the current transformer 500 shown in the embodiment in FIG. 3, the current transformer 500 provided in this embodiment may achieve the same effect. It may be understood that relative positions of an end part of the first positive primary side winding 30 and an end part of the second positive primary side winding 40 are not limited in the embodiments, and the current transformer 500 has a large quantity of design possibilities, which can facilitate design variations.

The foregoing descriptions are merely some embodiments and implementations, but are not intended to limit their scope. Any variation or replacement readily figured out by a person skilled in the art shall fall within the scope of the embodiments.

What is claimed is:

1. A photovoltaic converter, configured to electrically connect to a first photovoltaic module and a second photovoltaic module, wherein the first photovoltaic module comprises a first positive electrode output end and a first negative electrode output end, the second photovoltaic module comprises a second positive electrode output end and a second negative electrode output end, and the photovoltaic converter comprises:

a current transformer comprising a magnetic structure, a first positive primary side winding, a second positive primary side winding, a negative primary side winding, and a first secondary side winding; and a power conversion circuit;

the first positive primary side winding passes through the magnetic structure, the first positive primary side winding comprises a first end part and a second end part, the first end part is electrically connected to the first positive electrode output end, and the second end part is electrically connected to the power conversion circuit;

the second positive primary side winding passes through the magnetic structure and is spaced from the first positive primary side winding, the second positive primary side winding comprises a third end part and a fourth end part, the third end part is electrically connected to the second positive electrode output end, and the fourth end part is electrically connected to the power conversion circuit;

the negative primary side winding passes through the magnetic structure and is spaced from the first positive primary side winding and the second positive primary side winding, the negative primary side winding comprises a fifth end part and a sixth end part, the fifth end part is electrically connected to the first negative electrode output end and the second negative electrode output end, and the sixth end part is electrically connected to the power conversion circuit; and the first secondary side winding is wound around the magnetic structure, and the first secondary side winding is configured to output a first induced current by coupling based on currents transmitted in the first positive primary side winding, the second positive primary side winding, and the negative primary side winding.

2. The photovoltaic converter according to claim 1, wherein the first end part, the third end part, and the sixth end part are located on one side of the magnetic structure, and the fifth end part, the fourth end part, and the second end part are located on the other side of the magnetic structure.

3. The photovoltaic converter according to claim 2, wherein the magnetic structure has a traversing channel, the first positive primary side winding comprises a first connection part, the second positive primary side winding comprises a first fastening part, the negative primary side winding comprises a first conductive part, the first connection part, the first fastening part, and the first conductive part all pass through the traversing channel and are spaced from each other, and the first conductive part is located between the first connection part and the first fastening part; and in an extension direction of the traversing channel, the first end part and the second end part are located at two opposite ends of the first connection part, the third end part is located at one end that is of the first fastening part and that faces the first end part, the fourth end part is located at the other end that is of the first fastening part and that faces the second end part, the fifth end part is located at one end that is of the first conductive part and that faces the second end part and the fourth end part, and the sixth end part is located at the other end that is of the first conductive part and that faces the first end part and the third end part.

4. The photovoltaic converter according to claim 3, wherein the photovoltaic converter further comprises a circuit board, the circuit board is electrically connected to the first photovoltaic module and the second photovoltaic module, and the circuit board is fastened to and electrically connected to the first end part, the second end part, the third end part, the fourth end part, the fifth end part, the sixth end part, and the power conversion circuit; and both the first end part and the second end part are located on one side that is of the fifth end part and that is close to the sixth end part, and both the third end part and the fourth end part are located on one side that is of the sixth end part and that is close to the fifth end part.

5. The photovoltaic converter according to claim 4, wherein, in a height direction of the magnetic structure, the first conductive part is located between the first connection part and the first fastening part; and, in the extension direction of the traversing channel, the fifth end part and the sixth end part are disposed in a staggered manner; and in a first direction, both the third end part and the fourth end part are located between the fifth end part and the sixth end part, the first end part is located on one side that is of the third end part and that is opposite to the sixth end part, and the second end part is located on one side that is of the fourth end part and that is opposite to the fifth end part; and the first direction is vertical to the extension direction of the traversing channel and is vertical to the height direction of the magnetic structure.

6. The photovoltaic converter according to claim 4, wherein, in a height direction of the magnetic structure, the first conductive part is located between the first connection part and the first fastening part; and in the extension direction of the traversing channel, the fifth end part and the sixth end part are disposed in a staggered manner; and in a first direction, both the third end part and the second end part are located between the fifth end part and the sixth end part, the first end part is located on one side that is of the third end part and that is opposite to the sixth end part, and the fourth end part is located on one side that is of the second end part and that is opposite to the fifth end part; and the first direction is vertical to the extension direction of the traversing channel and is vertical to the height direction of the magnetic structure.

7. The photovoltaic converter according to claim 3, wherein the first positive primary side winding comprises a second connection part and a third connection part, both the second connection part and the third connection part extend in the height direction of the magnetic structure, the second connection part and the third connection part are respectively connected to two opposite end parts of the first connection part, the second connection part and the third connection part are located on two opposite sides of the magnetic structure, an end part that is of the second connection part and that is opposite to the first connection part is the first end part, and an end part that is of the third connection part and that is opposite to the first connection part is the second end part;

the second positive primary side winding comprises a second fastening part and a third fastening part, both the second fastening part and the third fastening part extend in the height direction of the magnetic structure, the second fastening part and the third fastening part are respectively connected to two opposite end parts of the first fastening part, the second fastening part is disposed on one side that is of the magnetic structure and that faces the second connection part, and is spaced from the second connection part, the third fastening part is disposed on one side that is of the magnetic structure and that faces the third connection part, and is spaced from the third connection part, an end part that is of the second fastening part and that is opposite to the first fastening part is the third end part, and an end part that is of the third fastening part and that is opposite to the first fastening part is the fourth end part; and the negative primary side winding comprises a second conductive part and a third conductive part, both the second conductive part and the third conductive part extend in the height direction of the magnetic structure, the second conductive part and the third conductive part are respectively connected to two opposite end parts of the first conductive part, the second conductive part is disposed on one side that is of the magnetic structure and that faces the third connection part and the third fastening part, and is spaced from the third connection part and the third fastening part, the third conductive part is disposed on one side that is of the magnetic structure and that faces the second connection part and the second fastening part, and is spaced from the second connection part and the second fastening part, an end part that is of the second conductive part and that is opposite to the first conductive part is the fifth end part, and an end part that is of the third conductive part and that is opposite to the first conductive part is the sixth end part.

8. The photovoltaic converter according to claim 3, wherein the first connection part, the first fastening part, and the first conductive part all extend in the extension direction of the traversing channel.

9. The photovoltaic converter according to claim 3, wherein, in the extension direction of the traversing channel, a spacing between the first end part and the second end part, a spacing between the third end part and the fourth end part, and a spacing between the fifth end part and the sixth end part are equal.

10. The photovoltaic converter according to claim 3, wherein, in a direction vertical to the extension direction of the traversing channel, a projection of the first connection part, a projection of the first fastening part, and a projection of the first conductive part all overlap.

11. The photovoltaic converter according to claim 3, wherein the magnetic structure is provided with an air gap, and the air gap communicates with the traversing channel.

12. The photovoltaic converter according to claim 11, wherein the magnetic structure comprises a first magnetic core and a second magnetic core, and the first magnetic core is spaced opposite to the second magnetic core and has the air gap.

13. The photovoltaic converter according to claim 1, wherein the current transformer further comprises a fastener, the magnetic structure is fastened to the fastener, and the first positive primary side winding, the second positive primary side winding, and the negative primary side winding penetrate into the fastener; and the first end part, the second end part, the third end part, the fourth end part, the fifth end part, and the sixth end part are located on one side that is of the fastener and that is opposite to the magnetic structure.

14. The photovoltaic converter according to claim 1, wherein the current transformer further comprises a second secondary side winding, the second secondary side winding is wound around the magnetic structure, and is spaced from the first secondary side winding, and the second secondary side winding is configured to output a second induced current by coupling based on the currents transmitted in the first positive primary side winding, the second positive primary side winding, and the negative primary side winding.

15. The photovoltaic converter according to claim 1, wherein the power conversion circuit comprises a boosting module and an inverter module; and the boosting module is electrically connected to the second end part, the fourth end part, and the sixth end part, and is electrically connected to the inverter module.

16. The photovoltaic converter according to claim 1, wherein the photovoltaic converter further comprises a detection module, and the detection module is electrically connected to the first secondary side winding.

17. A photovoltaic generation system, comprising:
a photovoltaic converter,
a first photovoltaic module, and
a second photovoltaic module,
wherein the first photovoltaic module comprises a first positive electrode output end and a first negative electrode output end, the second photovoltaic module comprises a second positive electrode output end and a second negative electrode output end, and the photovoltaic converter comprises a current transformer and a power conversion circuit;
the current transformer comprises a magnetic structure, a first positive primary side winding, a second positive primary side winding, a negative primary side winding, and a first secondary side winding;
the first positive primary side winding passes through the magnetic structure, the first positive primary side winding comprises a first end part and a second end part, the first end part is electrically connected to the first positive electrode output end, and the second end part is electrically connected to the power conversion circuit;
the second positive primary side winding passes through the magnetic structure, and is spaced from the first positive primary side winding, the second positive primary side winding comprises a third end part and a fourth end part, the third end part is electrically connected to the second positive electrode output end, and the fourth end part is electrically connected to the power conversion circuit;
the negative primary side winding passes through the magnetic structure, and is spaced from the first positive primary side winding and the second positive primary side winding, the negative primary side winding comprises a fifth end part and a sixth end part, the fifth end part is electrically connected to the first negative electrode output end and the second negative electrode output end, and the sixth end part is electrically connected to the power conversion circuit; and
the first secondary side winding is wound around the magnetic structure, and the first secondary side winding is configured to output a first induced current by coupling based on currents transmitted in the first positive primary side winding, the second positive primary side winding, and the negative primary side winding.

18. The photovoltaic generation system according to claim 17, wherein the first end part, the third end part, and the sixth end part are located on one side of the magnetic structure, and the fifth end part, the fourth end part, and the second end part are located on the other side of the magnetic structure.

19. The photovoltaic generation system according to claim 18, wherein the magnetic structure has a traversing channel, the first positive primary side winding comprises a first connection part, the second positive primary side winding comprises a first fastening part, the negative primary side winding comprises a first conductive part, the first connection part, the first fastening part, and the first conductive part all pass through the traversing channel and are spaced from each other, and the first conductive part is located between the first connection part and the first fastening part; and
in an extension direction of the traversing channel, the first end part and the second end part are located at two opposite ends of the first connection part, the third end part is located at one end that is of the first fastening part and that faces the first end part, the fourth end part is located at the other end that is of the first fastening part and that faces the second end part, the fifth end part is located at one end that is of the first conductive part and that faces the second end part and the fourth end part, and the sixth end part is located at the other end that is of the first conductive part and that faces the first end part and the third end part.

20. The photovoltaic generation system according to claim 19, wherein the photovoltaic converter further comprises a circuit board, the circuit board is electrically connected to the first photovoltaic module and the second photovoltaic module, and the circuit board is fastened to and electrically connected to the first end part, the second end part, the third end part, the fourth end part, the fifth end part, the sixth end part, and the power conversion circuit; and both the first end part and the second end part are located on one side that is of the fifth end part and that is close to the sixth end part, and both the third end part and the fourth end part are located on one side that is of the sixth end part and that is close to the fifth end part.

* * * * *